(12) United States Patent
Watanabe et al.

(10) Patent No.: US 6,265,812 B1
(45) Date of Patent: Jul. 24, 2001

(54) ELECTRON MULTIPLIER

(75) Inventors: Hiroyuki Watanabe; Yutaka Kusuyama; Masahiko Iguchi, all of Shizuoka-ken (JP)

(73) Assignee: Hamamatsu Photonics K.K., Shizuoka-ken (JP)

( * ) Notice: Subject to any disclaimer, the term of this patent is extended or adjusted under 35 U.S.C. 154(b) by 0 days.

(21) Appl. No.: 09/297,680

(22) PCT Filed: Nov. 6, 1997

(86) PCT No.: PCT/JP97/04047

§ 371 Date: Aug. 18, 1999

§ 102(e) Date: Aug. 18, 1999

(87) PCT Pub. No.: WO98/20518

PCT Pub. Date: May 14, 1998

(30) Foreign Application Priority Data

Nov. 6, 1996 (JP) .................................................. 8-294124
Nov. 6, 1996 (JP) .................................................. 8-294131

(51) Int. Cl.[7] ............................ H01J 43/24; H01J 37/244
(52) U.S. Cl. .......................... 313/103 CM; 313/105 CM; 313/532; 313/528
(58) Field of Search ..................... 313/528, 532, 313/103 CM, 105 CM, 544; 250/207, 214 UT

(56) References Cited

U.S. PATENT DOCUMENTS

| 3,896,308 | 7/1975 | Venables et al. | 250/305 |
| 4,731,538 | 3/1988 | Gray | 250/397 |
| 5,402,034 | * 3/1995 | Blouch et al. | 313/103 CM X |
| 5,633,493 | * 5/1997 | Suzuki et al. | 250/207 X |

FOREIGN PATENT DOCUMENTS

| 2180521 | * 11/1973 | (FR) . |
| 62-50672 | 3/1987 | (JP) . |
| 63-108655 | 5/1988 | (JP) . |
| 2-18850 | 1/1990 | (JP) . |
| 2-275368 | 11/1990 | (JP) . |
| 6-310076 | 11/1994 | (JP) . |
| 8-179045 | 7/1996 | (JP) . |
| 9-106777 | 4/1997 | (JP) . |

OTHER PUBLICATIONS

"Use of Brightness Amplifier Based on Microchannel Plate in High–Resolution Transmission Electron Microscope," N.D. Zakharov et al., Instruments and Experimental Techniques, (1987) March–Arpil, No. 2, Part 2.

"Low–Profile High–Efficiency Microchannel–Plate Detector System for Scanning Electron Microscopy Applications," Postek et al., Review of Scientific Instruments, vol. 61, No. 6, Jun. 1990, pp. 1648–1657.

* cited by examiner

Primary Examiner—Ashok Patel
(74) Attorney, Agent, or Firm—Morgan, Lewis & Bockius LLP

(57) ABSTRACT

The present invention relates to an electron multiplier including a structure which effectively prevents an electric field from leaking to the front side of an MCP due to a voltage applied to the MCP, facilitates an operation of attaching/detaching the MCP, and prevents the MCP from being damaged and so forth during the operation. The electron multiplier includes an MCP as electron multiplying means, and an outer electric field shield member for accommodating the MCP. The electric field shield cap includes a body portion surrounding at least a side face of the MCP. The electron multiplier further includes a structure by which, while the MCP is held by the outer electric field shield member and an inner electric field shield member accommodated in the outer electric field shield member, the outer electric field shield member is attached to a base of the electron multiplier so as to facilitate the operation of attaching/detaching the MCP.

23 Claims, 17 Drawing Sheets

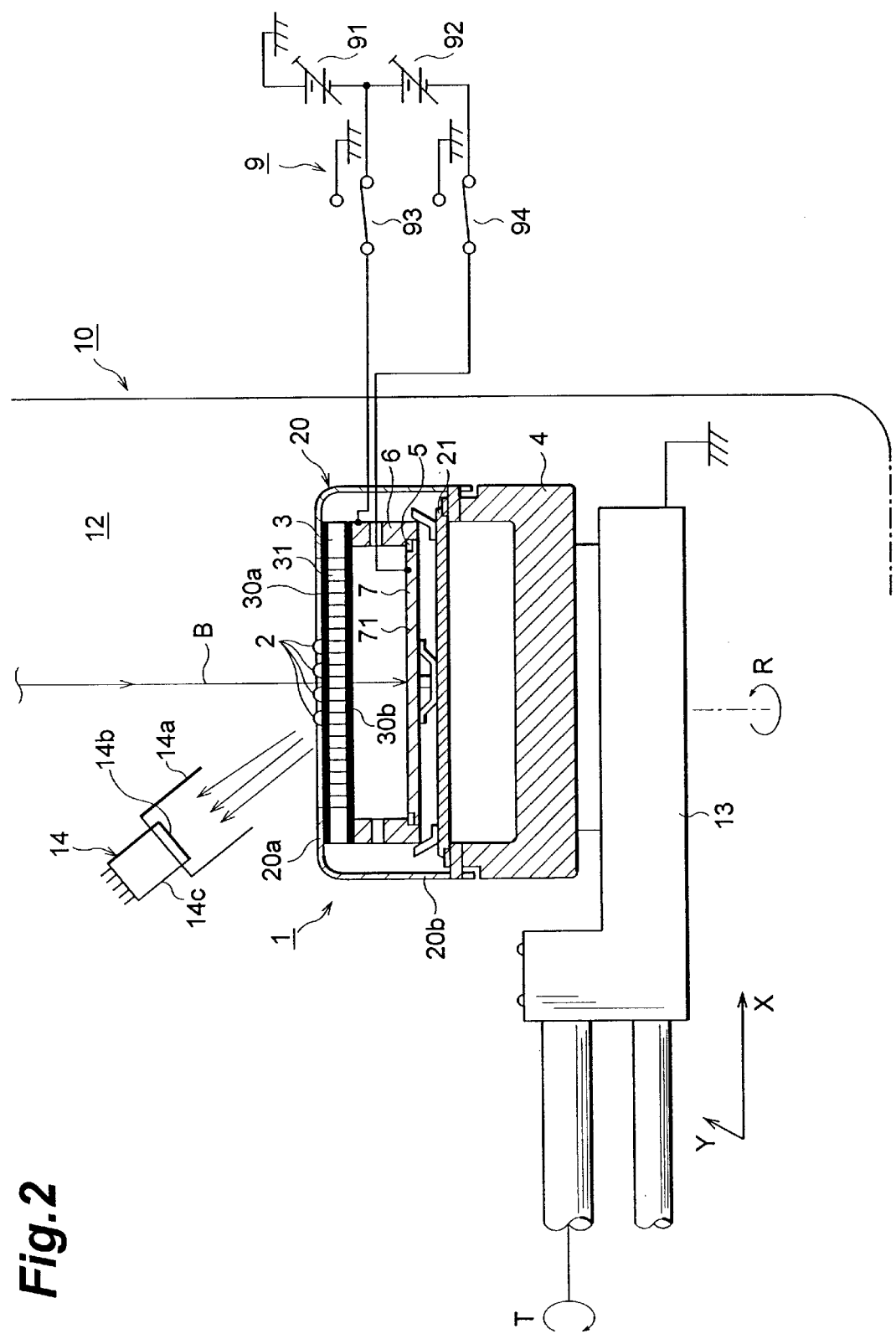

EQUIPOTENTIAL LINE

ELECTRON MULTIPLIER

DESCRIPTION

1. Technical Field

The present invention relates to a device applicable, for example, to electron microscopes; and, in particular, to an electron multiplier for multiplying incident electrons and outputting thus multiplied electrons.

2. Background Art

As conventional electron microscopes, those of reflection type and transmission type have been known. To these electron microscopes, an electron multiplier equipped with a microchannel plate (hereinafter referred to as MCP) having a plurality of channels for electron multiplication is applicable as electron multiplying means.

Here, the reflection type electron microscope is an apparatus which detects secondary electrons from a sample generated by an electron beam emitted toward the sample, and processes the resulting signal, so that an image of the sample is observed. On the other hand, the transmission type electron microscope is an apparatus which detects electrons transmitted through a sample irradiated with an electron beam, so that an image of the sample is observed.

The electron beam apparatus disclosed in Japanese Patent Application Laid-Open No. 2-275368 and the like, for example, have been known as the prior art related to the above-mentioned reflection type electron microscope, whereas the electron beam apparatus disclosed in Japanese Patent Application Laid-Open No. 6-310076 and the like, for example, have been known as the prior art related to the above-mentioned transmission type electron microscope.

DISCLOSURE OF THE INVENTION

As a result of studies of conventional electron microscopes, the inventors have found the following problems. Namely, with the reflection type electron microscope, transmitted electron images formed by electrons transmitted through a sample cannot be observed. In other words, though a surface of the sample can be observed therewith, the inner structure of the sample and the like cannot be observed, whereby separate transmission type viewing equipment is necessary for observing such an inner structure and the like.

With the transmission scanning electron beam apparatus, on the other hand, while a transmitted electron image formed by electrons transmitted through a sample can be observed by an electron detector installed below the sample (in a space opposing the space where an electron source is installed with respect to the sample), and a reflected electron image formed by secondary electrons from the sample can be observed by an electron detector located above the sample, the dedicated electron detectors are necessary for obtaining the respective electron images. Also, a signal selecting circuit for selecting the respective signals of the electron detectors is necessary along therewith. Consequently, the apparatus becomes complicated, thereby increasing the size and cost thereof.

For example, in cases where a voltage to an MCP (electron multiplying means) of an electron multiplier employed in such an electron microscope is selectively supplied and stopped, so that the reflected electron image and transmitted electron image can be observed alternately, an electric field may leak to the front side of the MCP when the voltage is supplied thereto, whereby the electron beam incident on the sample may be bent by the leakage electric field. Due to this phenomenon, each part of the resulting transmitted electron image shifts to a position different from that of the reflected electron image. According to the experiments conducted by the inventors, such electron image shifting occurred by about 3 $\mu$m when a voltage of 700 V was applied to the MCP, whereby the amount of shift between the electron images would not be negligible anymore when observed at a high magnification (e.g., 1 $\mu$m×1 $\mu$m).

In addition, when it comes to the handling of the electron multiplier equipped with the MCP, it has conventionally been necessary for a skilled person to take considerable care in replacing the MCP in the electron multiplier in order to prevent the MCP from being damaged or contaminated. In particular, the conventional structure for mounting the electron multiplier has such a configuration that the MCP unit is hard to remove therefrom, whereby it has been necessary to replace the whole electron multiplier in its already mounted apparatus.

In order to overcome the problems such as those mentioned above, it is an object of the present invention to provide an electron multiplier comprising a structure which effectively prevents an electric field from leaking to the vicinity of an MCP due to a voltage applied to the MCP, facilitates an operation of attaching/detaching the MCP, and prevents the MCP from being damaged and so forth during the operation.

Namely, the present invention relates to an electron multiplier equipped with a microchannel plate (MCP) having a plurality of channels for multiplying an incident electron and outputting thus multiplied electron, the MCP being provided with a first electrode on a first surface positioned on a side where the electron is incident, and a second electrode on a second surface opposing the first surface. The plurality of channels extend along a predetermined reference axis from the first surface toward the second surface.

In particular, in order to prevent an electric field from leaking due to a voltage supplied to the MCP acting as an electron multiplying means, the electron multiplier according to the present invention comprises an electric field shield cap (outer electric field shield member) accommodating the MCP. The electric field shield cap has a body portion surrounding at least a side face of the MCP while being separated therefrom by a predetermined distance. Further, in order for the electric field to be more effectively restrained from leaking to the front side of the MCP, the electric field shield cap preferably comprises a support portion (outer support portion) extending from a first end part of the body portion toward the reference axis and supporting the MCP. This support portion has an opening for exposing the first surface of the MCP, and this electric field shield member having this support portion realizes an MCP support structure and an electric field shield function at the same time.

Also, the electron multiplier according to the present invention comprises a base for mounting the electric field shield cap accommodating the MCP therein, thereby realizing a structure which can effectively restrain the MCP from being damaged and so forth during an operation of replacing the MCP and attain a sufficient electric field shield effect. Namely, a second end of the electric field shield cap opposing a first end thereof (an end part provided with the support portion) is detachably mounted to the base, thereby realizing a structure in which the base and the electric field shield cap are electrically connected to each other.

In this configuration, as the electric field shield cap is grounded while being electrically insulated from the first electrode formed on the first surface of the MCP or while being electrically in contact with the first electrode through a predetermined insulating member, it is shielded from the electric field occurring when a voltage is supplied to the MCP, whereby the electric field can be effectively restrained from leaking to the front side of the MCP (the space on the side where the electron source is installed with respect to the MCP) (i.e., the influence of the electric field on the electron beam orbit can be eliminated). When the electric field shield cap and the first surface of the MCP (or the first electrode formed on the first surface) are electrically insulated from each other, the first electrode can be set to a potential other than the ground potential.

The electron multiplier according to the present invention may further comprise an intermediate member (inner electric field shield member) accommodated within a space defined by the electric field shield cap while being electrically insulated from the electric field shield cap while being electrically in contact with the second surface of the MCP. This member is an electrically conductive member extending along the body portion of the electric field shield cap and having an opening for exposing the second surface of the MCP. More preferably, the intermediate member comprises a support portion (inner support portion), provided at a first end thereof electrically connected to the second electrode on the MCP, for holding the MCP in cooperation with the support portion of the electric field shield cap.

Thus, the electric field shield cap electrically connected to the first electrode disposed on the first surface of the MCP functions as an outer electrode of the MCP, whereas the electrically conductive intermediate member (inner electric field shield member) electrically connected to the second electrode provided on the second surface of the MCP functions as an inner electrode of the MCP. Since this structure holds the first and second surfaces of the MCP by the respective support portions of these two electrically conductive members, the attaching/detaching operation is easy, the MCP is prevented from being damaged during the operation, and the operation of replacing the MCP can easily be carried out.

In addition, in accordance with the present invention, since the electric field shield cap and the base are electrically connected to each other and grounded, the electric field can be securely prevented from leaking out of the electron multiplier, whereby the potential change caused by power feed switching would not reach the outside and would not affect the electron beam orbit. Consequently, when the electron multiplier is employed in an electron microscope, the deviation of the transmitted electron image and reflected electron image from each other in the field of view can be eliminated.

As a structure for securing the MCP to the electric field shield cap, a securing structure by a predetermined adhesive, a mechanical screwing structure, or the like, for example, is employable in the electron multiplier according to the present invention.

When securing the MCP to the electric field shield cap with an adhesive, the electron multiplier comprises a first electrically conductive adhesive, provided between the support portion of the electric field shield cap and the first surface of the MCP, for securing the MCP to the electric field shield cap; a second electrically conductive adhesive, provided between the support portion of the electrically conductive intermediate member and the second surface of the MCP, for securing the electrically conductive intermediate member to the MCP; and an insulating adhesive, provided in a space between a side face of the MCP and the body portion of the electric field shield cap, for securing the electrically conductive intermediate member to the electric field shield cap while the intermediate member and the electric field shield cap are electrically insulated from each other.

As another securing structure, an insulating member may be arranged within a space defined by a side face of the MCP, the support portion of the electric field shield cap, and the support portion of the electrically conductive intermediate member, such that the support portion of the electric field shield cap, the insulating member, and the support portion of the electrically conductive intermediate member are mechanically secured with an insulating screw penetrating through each thereof. According to this structure, the MCP can be held by the respective support portions of the electric field shield cap and electrically conductive intermediate member easily and reliably.

The electrically conductive intermediate member accommodated in the electric field shield cap may be configured so as to be mounted either directly or indirectly to the base attached to the second end of the electric field shield cap. Namely, in the structure in which the electrically conductive intermediate member is mounted onto the main surface of a circuit board which has already been attached to the base, mounting the second end of the electric field shield cap to the base can easily realize the structure for holding the MCP by the support portion of the electric field shield cap and the support portion of the electrically conductive intermediate member. Also, when replacing the MCP, it is unnecessary to replace the electrically conductive intermediate member, whereby the cost of the replaceable MCP portion can be cut down.

In the structure in which the insulating member is provided between the support portion of the electric field shield cap and the first surface of the MCP in the electron multiplier according to the present invention, on the other hand, the first electrode provided on the first surface of the MCP and the electric field shield cap are electrically insulated from each other, whereby they can be set to their respective potentials different from each other. Here, the insulating member is provided with an opening for exposing the first surface of the MCP. Also, in this configuration, the electrically conductive intermediate member accommodated within the electric field shield cap can be designed so as to have a ring-like form, so that the distance between the MCP and an electron reflector attached, through an insulating member, to the second end of the electrically conductive intermediate member (the end part of the electrically conductive member opposing the first end electrically in contact with the second electrode formed on the second surface of the MCP) can be shortened, thus enabling efficient electron multiplication.

In addition, the electron multiplier according to the present invention comprises a circuit board disposed between an electron reflector attached, through the insulating member, to the second end of the electrically conductive intermediate member and the base, the board having a spring electrode for pressing the electron reflector against the second end of the electrically conductive intermediate member, so that assembling steps such as securing operations and the like can be simplified.

BRIEF DESCRIPTION OF THE DRAWINGS

FIG. 2 is a sectional view showing the schematic configuration (including a voltage supply system) of a first embodiment of the electron multiplier according to the present invention in the state where it is employed in the electron microscope shown in FIG. 1;

BEST MODES FOR CARRYING OUT THE INVENTION

In the following, the electron multiplier according to the present invention will be explained with reference to FIGS. 1 to 26. In each embodiment, a case where the electron multiplier is employed in an electron microscope will be explained as an example. Among the drawings, the same numerals or letters indicate the same or equivalent parts, without repeating their overlapping explanations.

Figure 1:
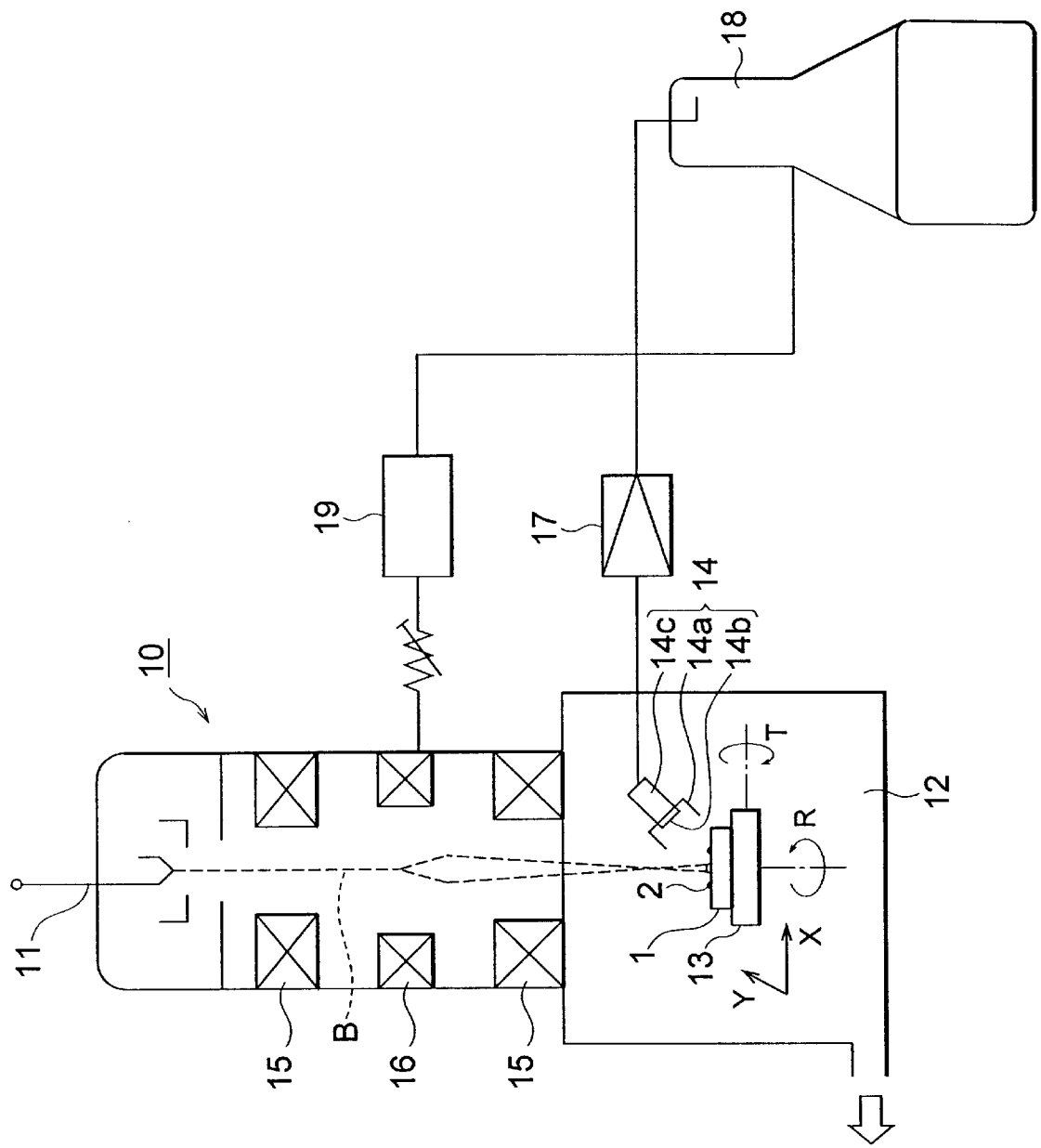
FIG. 1 is a sectional view showing the overall configuration of an electron microscope to which an electron multiplier according to the present invention is applied.

FIG. 1 is a view showing the overall configuration of an electron microscope employing the electron multiplier according to the present invention. The electron microscope 10 shown in FIG. 1 is a reflection type viewing apparatus with which a reflected electron image of a sample 2 can be observed, whose one end is provided with an electron gun 11 (electron source) for emitting an electron beam B, whereas the other end is provided with a vacuum chamber 12 adapted to be evacuated as needed. Disposed within the vacuum chamber 12 are a movable table 13 on which an electron multiplier 1 is installed, and an electron detector 14.

The movable table 13 provided with the electron multiplier 1 holding the sample 2 on its surface facing the electron gun 11 is adapted to move the electron multiplier 1 arbitrarily along horizontal axes (X and Y axes) orthogonal to each other and can arbitrarily be tilted about a horizontal axis (T axis). Also, the movable table 13 is rotatable about a vertical axis (R axis) passing through the center position.

The electron detector 14 is an apparatus which detects an electron from the sample 2 and converts thus detected electron into an electric signal. For example, it is constituted by a collector 14a for collecting the electron to be detected, a scintillator 14b which emits fluorescence when the electron is made incident thereon, and a photomultiplier tube 14c which generates a photoelectron in response to the fluorescence and outputs it as a multiplied electric signal.

In such an electron microscope, the electron beam B emitted from the electron gun 11 is converged by a predetermined electron lens 15 disposed between the electron gun 11 and the vacuum chamber 12, and is further scanned by a deflection coil 16, so as to irradiate the surface of the electron multiplier 1 (on which the sample 2 is installed) set on the movable table 13. The secondary electron generated by the electron beam B irradiating the sample 2 is detected by the electron detector 14 and is outputted as an electric signal therefrom. The detected electric signal is further amplified by an amplifier 17 and is fed to a CRT 18 as a video signal. At this time, as the deflection coil of the CRT 18 is synchronized with the deflection coil 16 for the electron beam B by a scanning power supply 19, an enlarged reflected electron image of the sample 2 is displayed on the CRT 18.

Figure 3A:
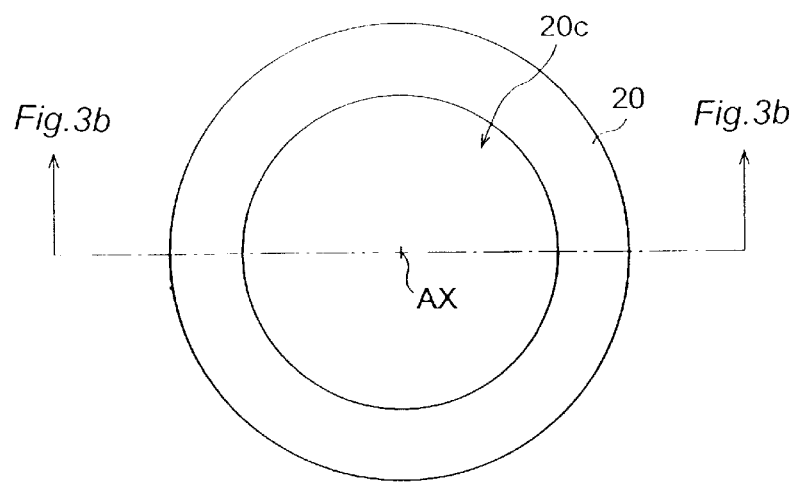
FIG. 3 is a plan and assembling view showing a major part of the electron multiplier shown in FIG. 2, wherein each member is illustrated by a sectional view taken along the line I—I of the plan view.
Figure 3B:
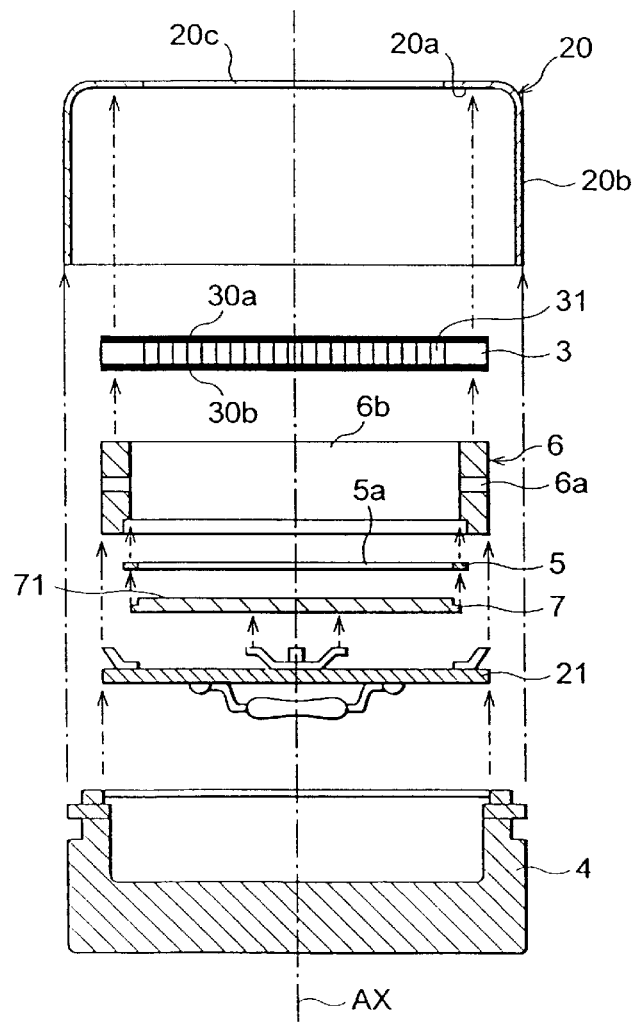
Figure 4A:
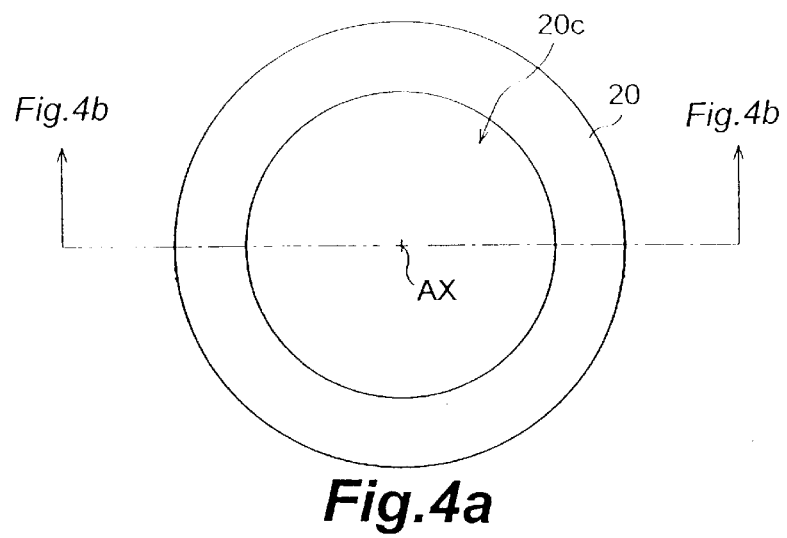
FIG. 4 is a view, identical to the plan and assembling view shown in FIG. 3, showing the major part of the electron multiplier according to the present invention, whose lines are partly omitted in order to clarify the cross-sectional form of each member.
Figure 4B:
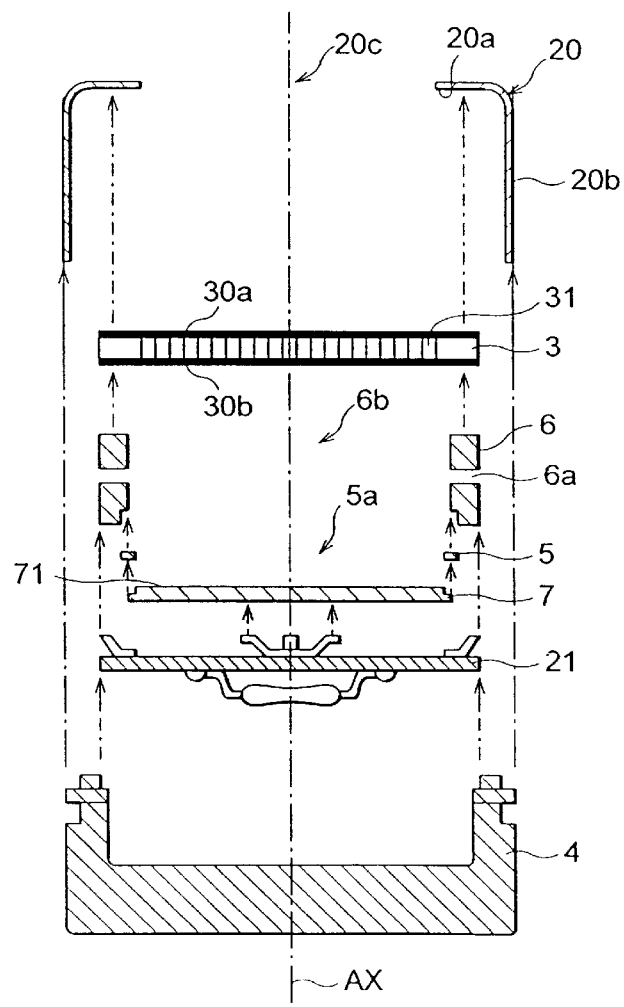
Figure 5:
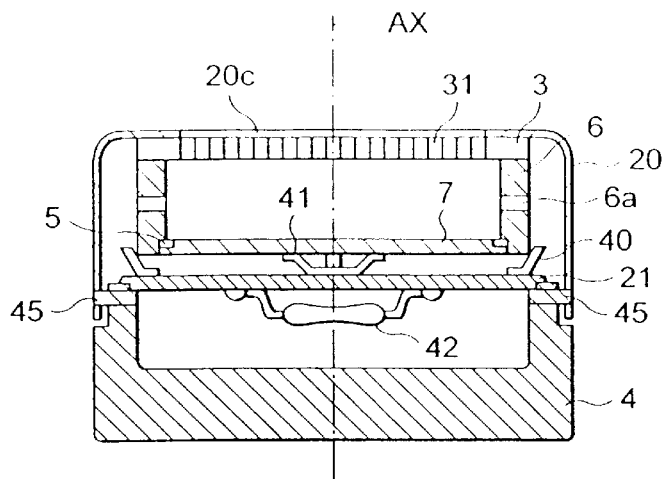
FIG. 5 is a sectional view showing the schematic configuration of the first embodiment of the electron multiplier according to the present invention.
Figure 6A:
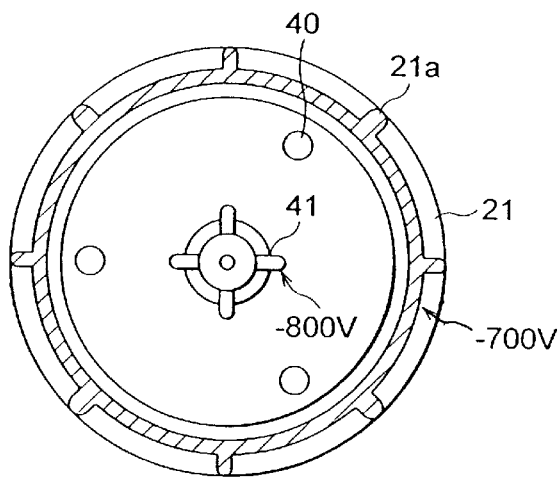
FIG. 6 is a view showing the structure of a circuit board incorporated in the electron multiplier shown in FIG. 5, whose individual sections show a plan view of the circuit board seen from the microchannel plate (MCP) side, a side view of the circuit board, and a plan view of the circuit board seen from the base side, respectively.
Figure 6C:
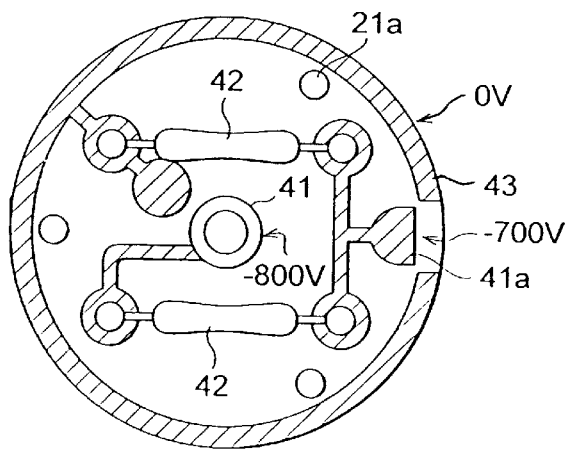
Figure 6B:
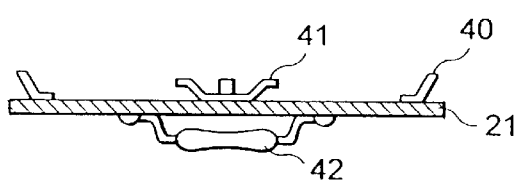
Figure 7:
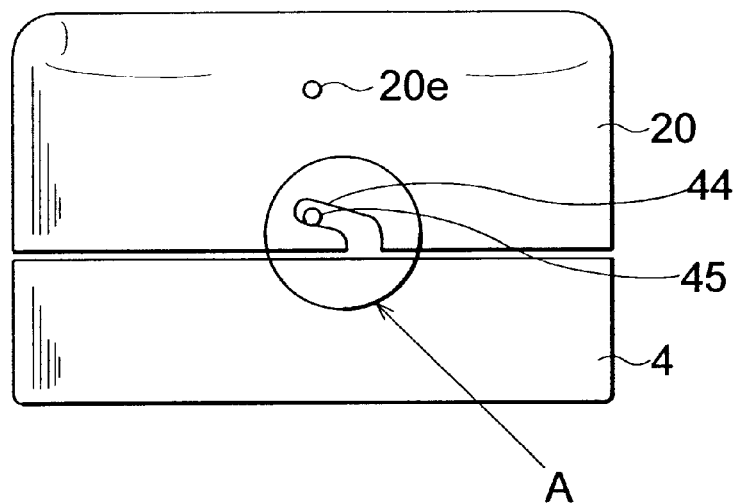
FIG. 7 is a view showing a state where an electric field shield cap (outer electric field shield member) is mounted to a base in the electron multiplier according to the present invention.

A first embodiment of the electron multiplier 1 according to the present invention will now be explained with reference to FIGS. 2 to 7. FIG. 2 is a sectional view showing the schematic configuration (including a voltage supply system) of the first embodiment of the electron multiplier according to the present invention in the state where it is employed in the electron microscope shown in FIG. 1. FIG. 3 is a plan and assembling view showing a major part of the electron multiplier 1 shown in FIG. 2, wherein each member is illustrated by a sectional view taken along the line I—I of the plan view. FIG. 4 is a view, identical to the plan and assembling view shown in FIG. 3, showing the major part of the electron multiplier according to the present invention, whose lines are partly omitted in order to clarify the cross-sectional form of each member. FIG. 5 is a sectional view showing the schematic configuration of the first embodiment of the electron multiplier according to the present invention. FIG. 6 is a view showing the structure of a circuit board incorporated in the electron multiplier shown in FIG. 5, whose individual sections show a plan view of the circuit board seen from the microchannel plate (MCP) side, a side view of the circuit board, and a plan view of the circuit board seen from the base side, respectively. FIG. 7 is a view showing a state where an electric field shield cap (outer electric field shield member) is mounted to a base in the electron multiplier according to the present invention.

As shown in FIG. 2, the electron multiplier 1 is installed on the movable table 13 within the electron microscope 10. Disposed in the upper part of main body portion of the electron multiplier 1 is a microchannel plate (MCP) 3 having a plurality of channels 31 for electron multiplication extending along a predetermined axis AX (axis aligning with the emitting direction of the electron beam B) from a first surface facing the electron gun 11 toward a second surface opposing the first surface. The MCP 3 is mounted at a first end of a ring body 6 acting as an electrically conductive intermediate member made of an electrically conductive member such as copper, whereas an electron reflector 7 is attached, through a ring-shaped insulating member 5 made of glass or the like, to a second end of the ring body 6 opposing the first end. Here, the ring body 6 and the insulating member 5 are formed with their respective through holes 6b, 5a for transmitting therethrough electrons from the MCP 6 to the electron reflector 7 or vice versa.

A first electrode 30a is formed on the first surface of the MCP 3 facing the electron gun 11, whereas a second electrode 30b is formed on the whole second surface opposing the first surface. The first and second electrodes 30a, 30b are formed by vapor deposition of Inconel, Ni—Cr alloy, or the like on each of the main surfaces (first and second surfaces) of the MCP 3.

The MCP 3 not only functions as a mount for installing the sample 2 to be observed, but also functions to multiply electrons passing through each channel 31 from the first surface toward the second surface. Namely, the inner wall of each of the numerous channels 31 within the MCP 3 is formed with a film made of a material adapted to release secondary electrons. When the MCP 3 is employed in a reflection type electron microscope, as a voltage is applied thereto such that the potential at the electron release surface (the first surface of the MCP 3 formed with the first electrode 30a as the output electrode) becomes higher than that at the electron entrance surface (the second surface of the MCP 3 formed with the second electrode 30b as the input electrode), electrons enter the channels 31 of the entrance surface and exit from the release surface after being multiplied as being reflected by the inner walls of the channels 31.

Also, as shown in FIG. 2, the electron multiplier 1 is provided with the electron reflector 7, separated from the MCP 3 by a predetermined distance, on the side opposite the space where the electron gun 11 is installed. The surface of the electron reflector 7 facing the MCP 3 is formed with a reflecting surface 71, which reflects the electron beam B passed through interstices between pieces of the sample 2 or through the sample 2 and further through the individual channels 31 of the MCP 3.

The electron multiplier 1 further comprises an electric field shield cap 20 (outer electric field shield member) which comes into contact with the peripheral portion of the first surface of the MCP 3 formed with the first electrode and surrounds the side face of the MCP 3 while being separated therefrom by a predetermined distance. The electric field shield cap 20 acts to prevent the electric field from leaking to the front side of the MCP 3, and is made of a metal, alloy, or the like, such as stainless steel, for example. Here, as shown in FIGS. 3 and 4, the electric field shield cap 20 is constituted by a body portion 20b extending along the reference axis AX (aligning with the advancing direction of the electron beam B) so as to surround the reference axis AX, and a support portion 20a extending from the first end of the body portion 20b toward the reference axis AX and having an opening 20c for exposing the first surface of the MCP 3.

Further, as can be seen from FIGS. 3 to 5, the electron reflector 7 having the reflecting surface 71 is attached, through the insulating member 5, to the second end of the ring body 6 opposing the first end. Installed between the electron reflector 7 and a base 4 is a circuit board 21 for supplying a predetermined voltage to each of the above-mentioned parts. As shown in FIG. 6, the front face of the circuit board 21 is provided with leaf springs 40, 41 (spring electrodes). Connected to the rear face of the circuit board 21 is a bleeder resistor 42 which subjects the voltage applied between a ring-shaped wire 43 formed at the periphery of lower surface of the circuit board 21 and the leaf spring 41 and the voltage applied between the ring-shaped wire 43 and a pad portion 41a to resistance division, so as to set them to different potentials. For example, in the case explained later, the ring-shaped wire 43 is grounded, whereas the leaf spring 41 and the pad portion 41a are set to −800 V and −700 V, respectively. Here, the leaf spring 41 is integrally formed through the upper and lower faces of the circuit board 21, whereas the pad portion 41a and the leaf spring 40 are conducting to each other through the upper and lower faces of the circuit board 21. Also, the circuit board 21 is connected to an external circuit (see FIG. 2), whereby a predetermined voltage is supplied thereto. Further, the circuit board 21 is provided with a vent hole 21a penetrating through the upper and lower face thereof.

The ring-shaped wire 43 is electrically connected to the base 4, and the first electrode 30a formed on the first surface of the MCP 3 is grounded through the electric field shield cap 20 mounted to the base 4. The leaf spring 41 supplies a voltage (−800 V) to the electron reflector 7 from the lower face of the circuit board 21; whereas the leaf spring 40 comes into contact with the ring body 6, thereby supplying a voltage (−700 V), through the ring body 6, to the second electrode 30b formed on the second surface. Therefore, the leaf spring 41 of the circuit board 21 functions to press the electron reflector 7 against the second end of the ring body 6 through the insulating member 5 inevitably when the electric field shield cap 20 is mounted to the base 4 with the circuit board 21 being installed at a predetermined position of the base 4 (see FIG. 7).

The individual members of the electron multiplier 1 according to the first embodiment are assembled as follows. Namely, the electron multiplier 1 is constituted by three kinds of parts, i.e., the electric field shield cap 20; an MCP portion composed of the MCP 3 and the ring body 6; and a sample mount portion composed of the insulating member 5, the electron reflector 7, the circuit board 21 made of a glass epoxy resin or the like, and the base 4. Among them, in the MCP portion, the MCP 3 and the ring body 6 are bonded to each other with an electrically conductive adhesive, for example, such as silver paste, carbon paste, indium paste, solder, or the like. Also, the sample mount portion is prepared as being fixed with such an electrically conductive adhesive and an insulating adhesive such as an epoxy resin adhesive, for example.

Here, the MCP portion may be made separately replaceable from the electron multiplier in order to cut down the cost of the replaceable part. Also, the MCP portion is not restricted to the one constituted by the MCP 3 and the ring body 6, but may have a configuration solely constituted by the MCP 3, a configuration including the insulating member 5 in addition to the MCP 3 and the ring body 6, or a configuration including the insulating member 5 and the electron reflector 7 in addition to the MCP 3 and the ring body 6. Various kinds of such combinations are possible depending on the easiness in handling when replacing the MCP portion, the cost balance of the parts to be replaced, and the like, whereas the MCP portion can be replaced as a single unit. Without being restricted to solder and adhesives, screwing or the like may similarly be employed for bonding the individual constituent members as will be explained later.

Further, as indicted by part A in FIG. 7, the electric field shield cap 20 can easily be attached to the base 4 by causing a fitting portion 44 of the electric field shield cap 20 (disposed at the second end opposing the first end having the support portion 20a) to fit a fitting pin 45 disposed at the table 4. Here, the electric field shield cap 20 and the ring body 6 are provided with their respective vent holes 20e, 6a.

As shown in FIG. 2, a voltage supply system 9 is connected to the MCP 3 and the electron reflector 7. While FIG. 2 illustrates connection lines only schematically, voltages are more specifically supplied by the voltage supply portion formed on the rear face of the circuit board 21 as shown in the above-mentioned FIG. 6.

The voltage supply system 9 comprises a variable power source 91 for applying a predetermined voltage between the first electrode 30a and second electrode 30b of the MCP 3, and a variable power source 92 for applying a predetermined voltage between the second electrode 30b of the MCP 3 and the electron reflector 7. Also, as switches 93, 94 are selectively operated, viewing modes of the electron microscope 10 employing the electron multiplier 1 can be switched. Namely, a transmitted electron image of the sample 2 is obtained when a voltage is supplied to the electron reflector 7 and the MCP 3, whereas a reflected electron image of the sample 2 is obtained when the electron reflector 7 and the MCP 3 are placed in a grounded state with no voltage being supplied thereto.

Operations of the electron microscope 10 equipped with the electron multiplier 1 according to the present invention will now be explained.

First, as shown in FIG. 2, the sample 2 to be observed is mounted on the first surface of the MCP 3 where the first electrode 30a is formed. The method of holding the sample 2 at the MCP 3 includes upper face fixation, interior embedding, intimate lower face contacting, and the like, which may be selectively employed depending on the material of the sample 2 and the viewing mode.

While carrying the sample 2, the MCP 3 is mounted on the ring body 6 of the electron multiplier 1. Subsequently, the electric field shield cap 20 is mounted to the base 4 so as to cover the MCP 3. Namely, in the electric field shield cap 20, the support portion 20a extending from the first end toward the reference axis AX is electrically connected to the first electrode formed on the first surface of the MCP 3 and covers the side face of the MCP 3. On the other hand, the second end of the electric field shield cap 20 is attached to the base 4, whereas both of the electric field shield cap 20 and the base 4 are grounded while being electrically connected to each other.

Thus configured electron multiplier 1 is set within the reflection type electron microscope 10. Namely, the main body portion (the portion excluding the voltage supply system 9) of the electron multiplier 1 is placed on the movable table 13 disposed within the vacuum chamber 12 in the electron microscope 10. Then, air is evacuated from the vacuum chamber 12, so that the latter attains a vacuum state therein.

Referring to a case where a transmitted electron image of the sample 2 is observed, the switches 93, 94 are selectively operated so as to supply voltages from the voltage supply system 9 such that the first electrode 30a disposed on the first surface (the surface to be irradiated with the electron beam B) of the MCP 3 is grounded, while a voltage of about −700 V is applied to the second electrode 30b disposed on the second surface of the MCP 3. Also, a voltage of about −800 V is applied to the electron reflector 7 such that its potential becomes lower than that of the second surface 30b of the MCP 3 by 100 V. Along therewith, predetermined voltages are applied to the collector 14a of the electron detector 14 located on the electron gun 11 side and its scintillator 14b such that they have potentials of +100 V and +10 kV, respectively, and the electron beam B is emitted toward the sample 2 on the MCP 3 as shown in FIGS. 1 and 2.

Of the electron beam B, a part irradiating locations other than the sample 2 or irradiating thinner portions of the sample 2 passes through interstices between pieces of the samples 2, i.e., through portions free of the sample 2, or through the sample 2, and then through the individual channels 31 within the MCP 3, thereby irradiating the reflecting surface 71 of the electron reflector 7. A part of the electron beam B irradiating the reflecting surface 71 is further reflected by the reflecting surface 71 as a reflected electron and generates a secondary electron.

Here, if the reflecting surface 71 has a protrusion or depression formed thereon, then the reflected and secondary electrons are released from the reflecting surface 71 in a diffused state. The reflected and secondary electrons from the reflecting surface 71 are reliably guided toward the MCP 3 whose potential is higher by 100 V.

Subsequently, the reflected and secondary electrons enter the individual channels 31 of the MCP 3 again, are multiplied every time they are reflected by the inner wall of the channel 31, and then are released from the first surface of the MCP 3 through the first electrode 30a. Here, since the sample 2 on the MCP 3 is irradiated with the reflected and secondary electrons from the electron reflector 7, the sample 2 positively charged upon irradiation of the electron beam B is neutralized, so as to keep its charge from increasing. The reflected and secondary electrons released from the first surface of the MCP 3 are guided to the collector 14a of the electron detector 14 set at a potential higher than that of the first electrode 30a, and are made incident on the scintillator 14b. The fluorescence from the scintillator 14b generated by the electrons made incident thereon is detected by the photomultiplier 14c as an electronic signal.

Though the electron beam B irradiating the sample 2 is reflected by the surface thereof and generates secondary electrons, they would not be multiplied by the MCP 3, and the amount thereof is much smaller than that of the multiplied reflected and secondary electrons from the above-mentioned reflecting surface 71 (on the order of $1/1000$ to $1/10000$), whereby they are only negligibly detectable by the electron detector 14.

The electric signal thus obtained by the electron detector 14 is amplified by the amplifier 17 and is fed as a video signal into the CRT 18 scanned in synchronization with the electron beam B, thereby being displayed on the CRT 18 as a transmitted electron image of the sample 2. Thus obtained transmitted electron image is displayed such that the part where the sample 2 is so thick that electrons cannot pass therethrough is dark, the part free of the sample 2 is bright, the part where sample 2 is so thin that the electrons partly pass therethrough has an intermediate brightness. As mentioned above, since the part where the sample 2 exists has a signal strength on the order of $1/1000$ to $1/10000$ that in the other parts, an electron image having a very clear contrast is obtained. Also, since the transmitted electron image is clear even when the amount of irradiation of the electron beam B is reduced, the amount of irradiation of the electron beam can be lowered so as to narrow the electron beam, thereby yielding a transmitted electron image with a high resolution.

Figure 8:
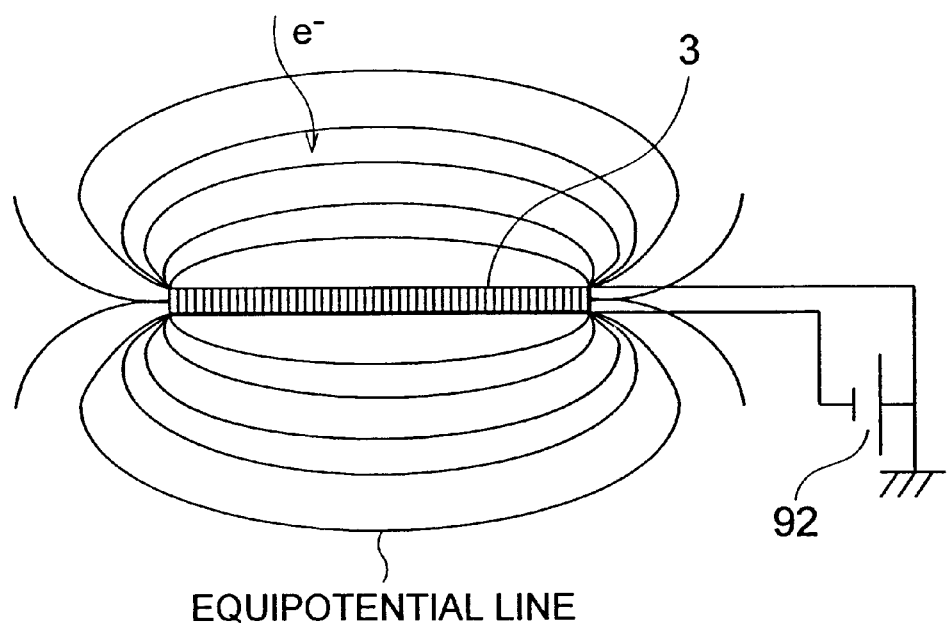
FIG. 8 is a view for explaining the state of an electric field generated in the vicinity of an MCP without electric field shielding.

Here, a case where the above-mentioned transmitted electron image is observed by means of an electron multiplier not equipped with the electric field shield cap 20 covering at least the side face of the MCP 3 will be explained. FIG. 8 is a schematic view showing the state of electric field in the electron multiplier not provided with the electric field shield cap 20, whereas FIG. 9 is a schematic view showing the state of electric field in the electron multiplier 1 provided with the electric field shield cap 20.

As can be seen from FIG. 8, in the case where the electric field shield cap 20 is not provided, when a predetermined voltage is applied to the MCP 3 and the electron reflector 7, the MCP 3 leaks out of the MCP 3 as indicated by equipotential lines in FIG. 8. Consequently, thus leaked electric field changes the orbit of the electron beam incident on the electron microscope, thereby yielding a deviation in field of view between the transmitted electron image and the reflected electron image.

Figure 9:
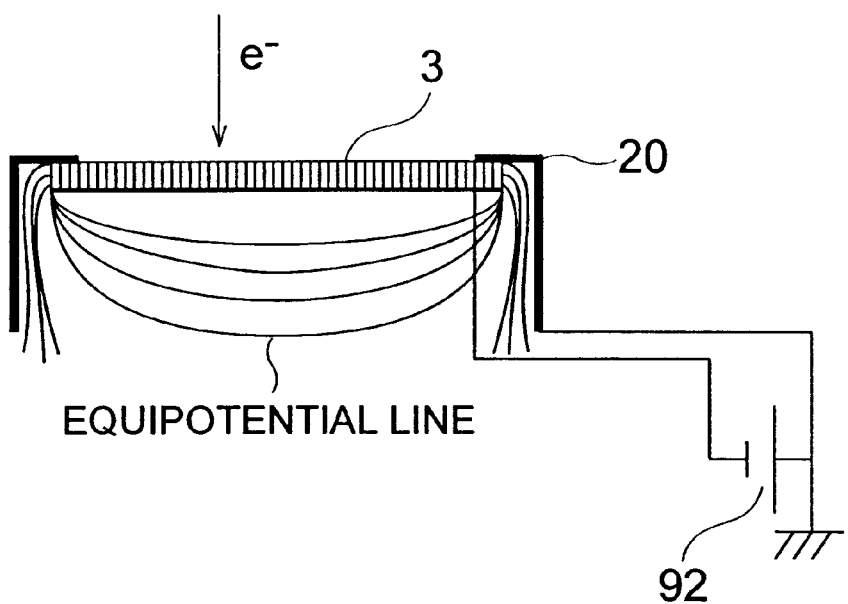
FIG. 9 is a view for explaining an electric shield effect caused by an electric field shield cap (outer electric field shield member) in the electron multiplier according to the present invention.

As shown in FIG. 9, on the other hand, in the electron multiplier in which the electric field shield cap 20 is mounted such that its support portion 20a is in contact with the first electrode disposed on the first surface of the MCP 3 and covers the side face of the MCP 3, while it also comes into contact with the base 4, the electric field can be prevented from leaking, as indicated by equipotential lines therein. Namely, in the MCP 3 and the electron reflector 7, the potential change caused by power feed switching would not reach the outside of the electron multiplier, and would not affect the electron beam orbit, whereby the deviation in field of view between the transmitted electron image and the reflected electron image can effectively be reduced. Consequently, there would be no fear of losing sight of the object to be observed, or it becomes unnecessary to correct the deviation in field of view. In the case where the transmitted electron image and the reflected electron image are displayed as being superposed on each other, the effects mentioned above are large in particular.

Referring to a case where a reflected electron image of the sample 2 is observed, on the other hand, it can easily be observed when the switches 93, 94 of the voltage supply system 9 shown in FIG. 9 are selectively operated. Namely, the switches 93, 94 are operated such that the MCP 3 and the electron reflector 7 are grounded (voltage application is stopped). As a consequence, the multiplying function of the MCP 3 and the reflecting function of the electron reflector 7 are ceased. When the electron beam B irradiates the sample 2 on the MCP 3 in this state, a part of the electron beam B which does not irradiate the sample 2 is not detected by the electron detector 14, and only the secondary electrons generated at the surface of the sample 2 are detected by the electron detector 14. Therefore, when the gain of the amplifier 17 is appropriately adjusted, it is possible to observe a reflected electron image which can be obtained with a conventional reflection type electron microscope.

Figure 10:
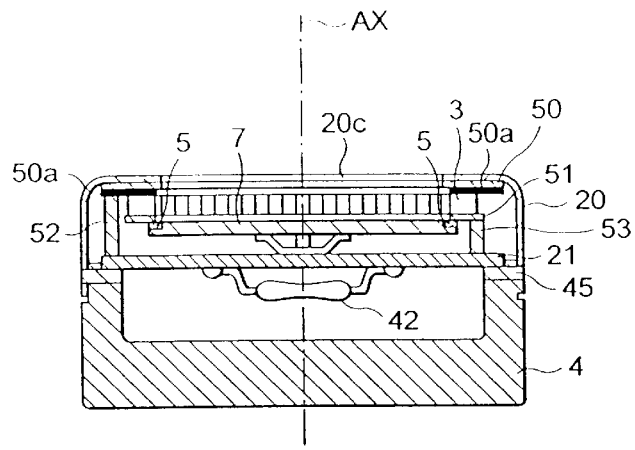
FIG. 10 is a sectional view showing the configuration of a second embodiment of the electron multiplier according to the present invention.
Figure 11A:
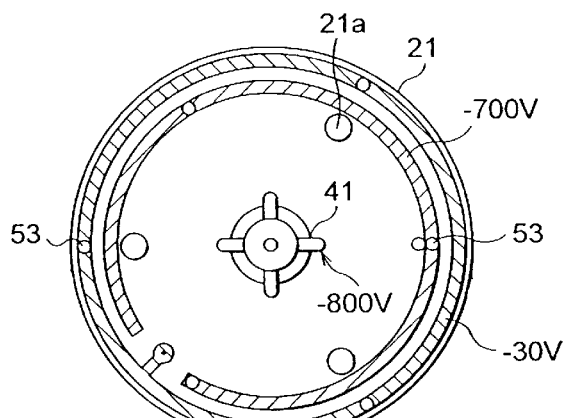
FIG. 11 is a view showing the configuration of the circuit board employed in the electron multiplier of FIG. 10, whose individual sections show a plan view of the circuit board seen from the MCP side, a side view of the circuit board, and a plan view of the circuit board seen from the base side, respectively.
Figure 11C:
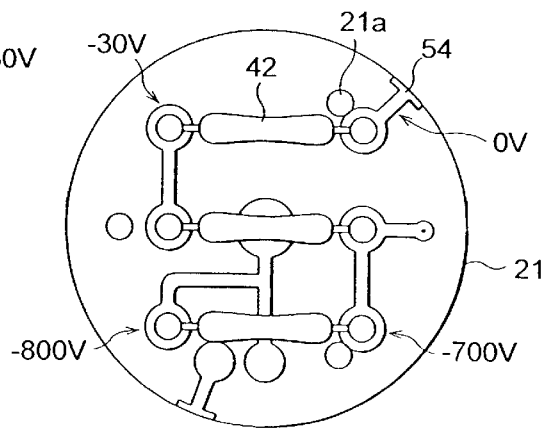
Figure 11B:
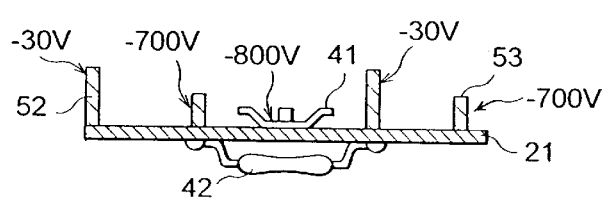

FIG. 10 is a sectional view showing the configuration of a second embodiment of the electron multiplier according to the present invention. FIG. 11 is a view showing the configuration of the circuit board employed in the electron multiplier of FIG. 10, whose individual sections show a plan view of the circuit board seen from the MCP side, a side view of the circuit board, and a plan view of the circuit board seen from the base side, respectively.

While the first electrode 30a provided on the first surface of the MCP 3 and the electric field shield cap 20 are electrically connected to each other and are individually grounded in the electron multiplier of the first embodiment shown in FIG. 5; the first electrode 30a disposed on the first surface of the MCP 3 and the electric field shield cap 20 are electrically separated from each other by a spacer 50 made of an insulating material in the electron multiplier of the second embodiment, so that they can be set to their respective potentials different from each other. Except for this feature, the second embodiment is basically similar to the first embodiment shown in FIG. 5.

Namely, as shown in FIG. 10, a glass epoxy substrate 50, which is an insulating member, is mounted at the peripheral portion of the first surface of the MCP 3, whereas the support portion 20a of the electric field shield cap 20 is installed on the glass epoxy substrate 50. Connected to the rear face of the circuit board 21 is a bleeder resistor 42, by which potentials of −800 V, −30 V, and −700 V are set between a pad portion 54 and the leaf spring 41, and between the pad portion 54 and pins 52, 53 formed on the surface of the circuit board 21, respectively.

Here, the part of the glass epoxy substrate 50 coming into contact with the peripheral portion of the MCP 3 is covered with an electrically conductive coating 50a. Byway of the electrically conductive coating 50a, a voltage is supplied from the circuit board 21 via the pin 52, whereby a potential of −30 V is set at the first surface (first electrode) of the MCP 3. Here, a voltage on the order of −100 V to +100 V can be set at the first surface of the MCP 3, and thus set voltage can appropriately be changed as the bleeder resistance ratio is adjusted, for example.

The electric field shield cap 20 is conducting and grounded, through the base 4, from the pad portion 54 formed on the rear face of the circuit board 21. Further, the peripheral portion of the second surface of the MCP 3 is provided with an electrically conductive ring-shaped member 51, which is electrically connected to the second electrode disposed on the second surface of the MCP 3. The voltage supplied from the circuit board 21 is fed, through the pin 53 and ring-shaped member 51, to the second electrode disposed on the second surface of the MCP 3, whereby the second surface is set to −700 V. A voltage of −800 V is supplied to the electron reflector 7 through the leaf spring 41.

When the set voltage of the first surface of the MCP 3 is adjusted to a value different from the ground voltage, then the reflected and multiplied electrons released from the MCP 3 can be collected by the electron detector 14 more efficiently.

Also, in the second embodiment, as the ring-shaped member 51 is used in place of the ring body 6 extending along the reference axis AX so as to surround the latter, the distance between the MCP 3 and the electron reflector 7 can be shortened, thus enabling more efficient electron multiplication.

Figure 12:
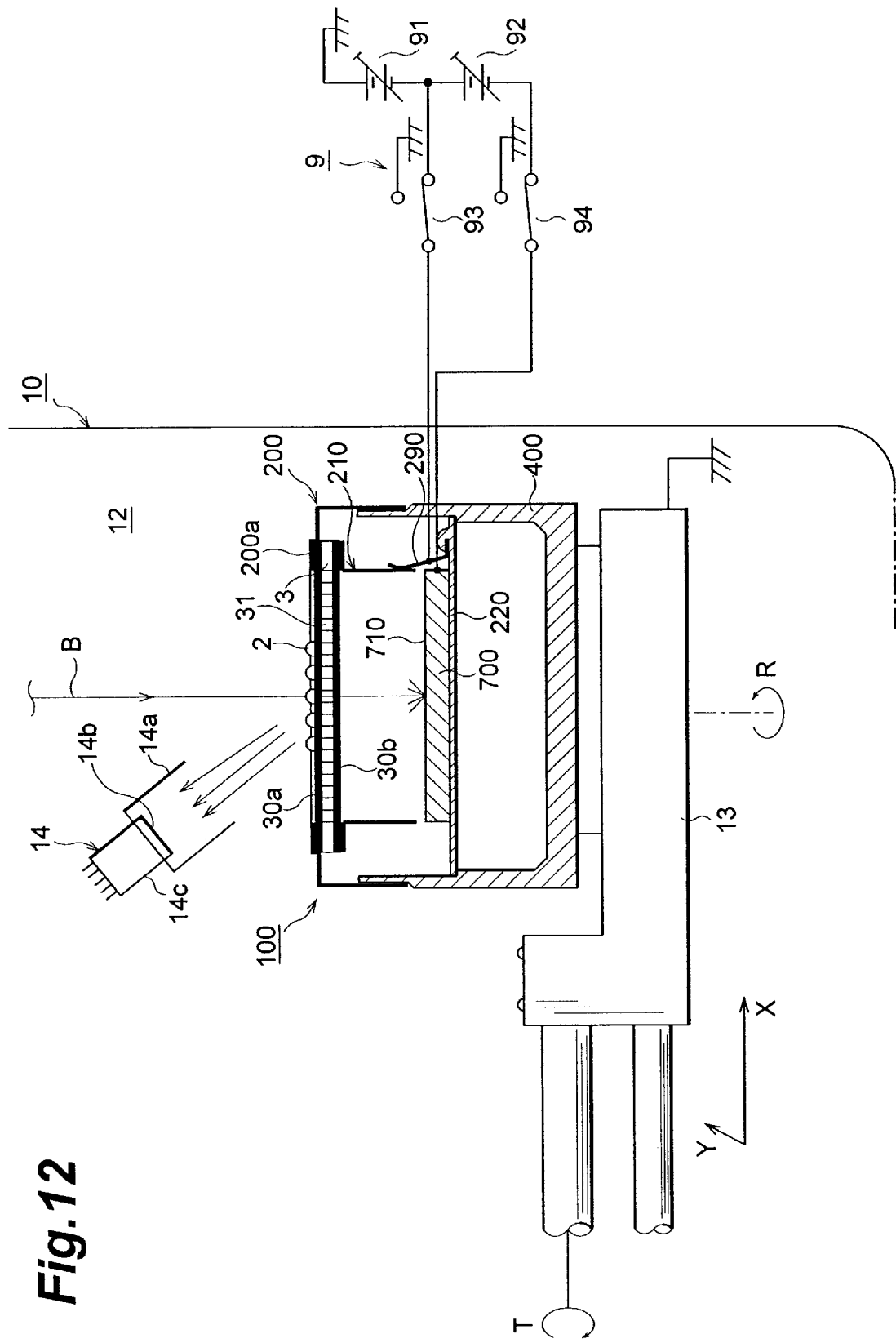
FIG. 12 is a sectional view showing the schematic configuration (including a voltage supply system) of a third embodiment of the electron multiplier according to the present invention in the state where it is employed in the electron microscope shown in FIG. 1.
Figure 13A:
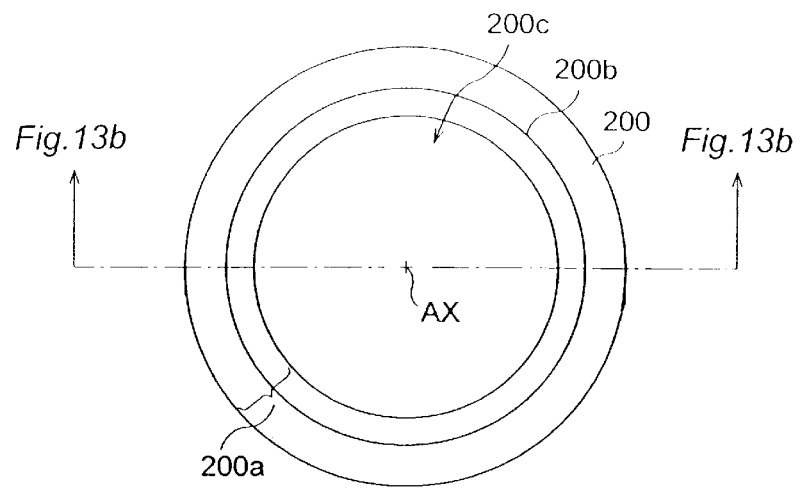
FIG. 13 is a plan and assembling view showing a major part of the electron multiplier shown in FIG. 12, wherein each member is illustrated by a sectional view taken along the line II—II of the plan view.
Figure 13B:
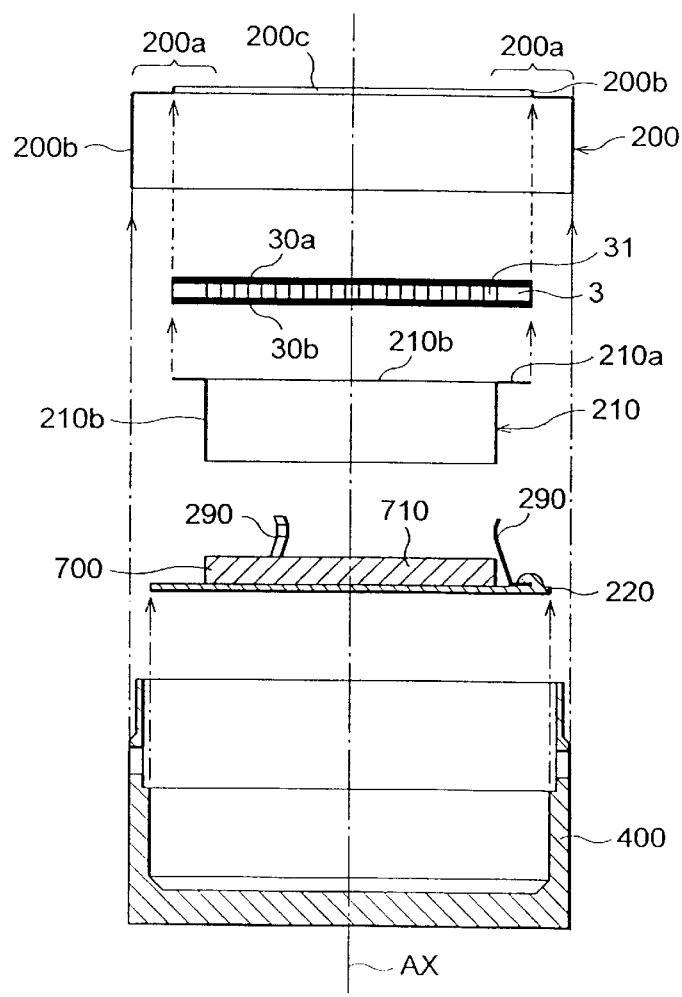
Figure 14A:
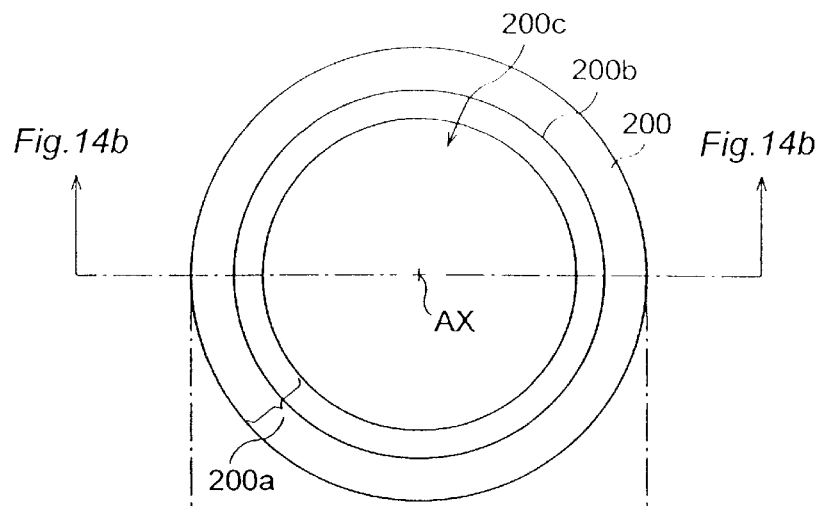
FIG. 14 is a view, identical to the plan and assembling view shown in FIG. 13, showing the major part of the electron multiplier according to the present invention, whose lines are partly omitted in order to clarify the cross-sectional form of each member.
Figure 14B:
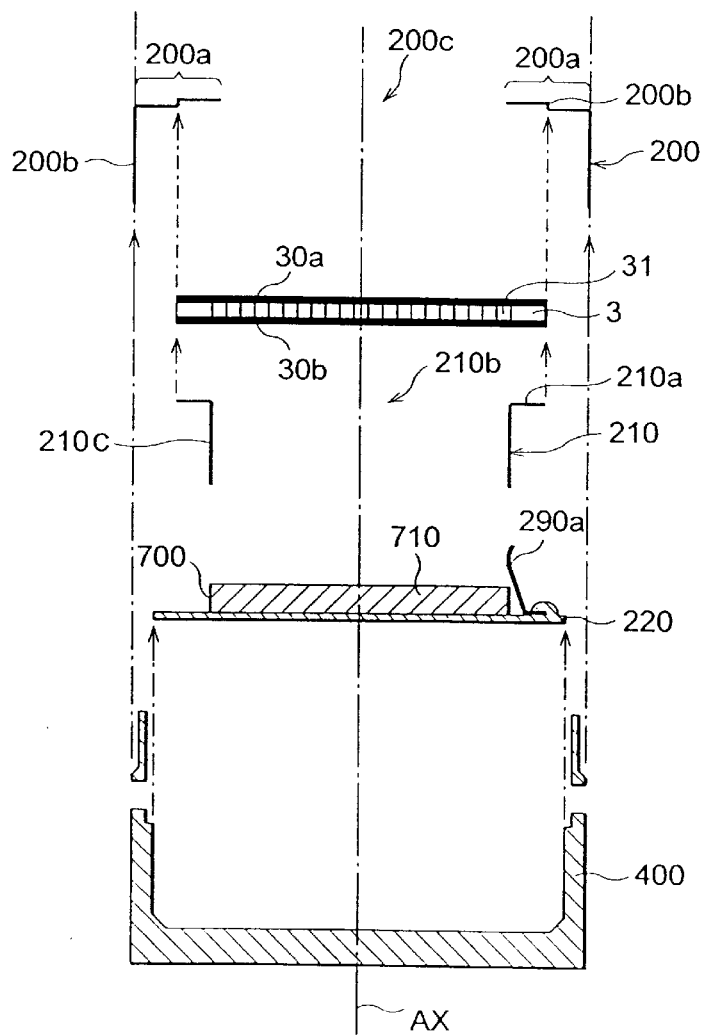
Figure 15:
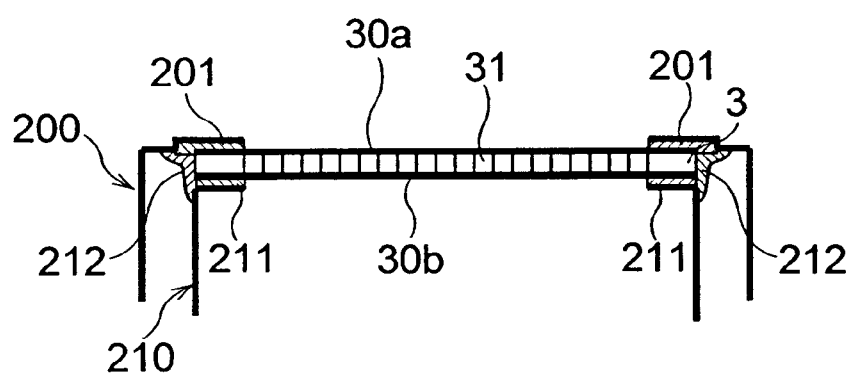
FIG. 15 is a sectional view showing a structure for holding the MCP in the third embodiment of the electron multiplier according to the present invention.
Figure 16:
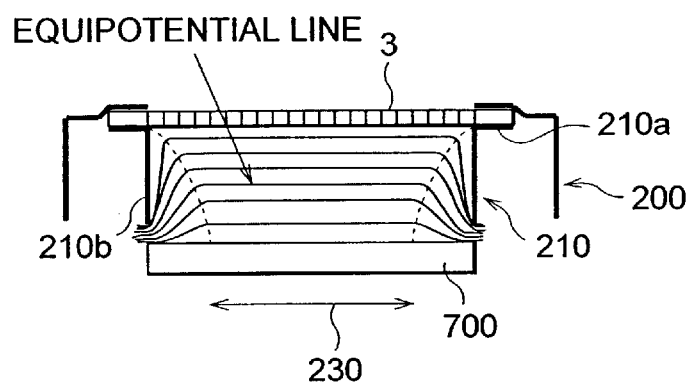
FIG. 16 is a schematic view showing the state of an electric field within an electrically conductive intermediate member (inner electric field shield member) having an outward support portion.

The configuration of a third embodiment of the electron multiplier according to the present invention will now be explained with reference to FIGS. 12 to 15. FIG. 12 is a sectional view showing the schematic configuration (including a voltage supply system) of the third embodiment of the electron multiplier according to the present invention in the state where it is employed in the electron microscope shown in FIG. 1. FIG. 13 is a plan and assembling view showing a major part of the electron multiplier shown in FIG. 12, wherein each member is illustrated by a sectional view taken along the line II—II of the plan view. FIG. 14 is a view, identical to the plan and assembling view shown in FIG. 13, showing the major part of the electron multiplier according to the present invention, whose lines are partly omitted in order to clarify the cross-sectional form of each member. FIG. 15 is a sectional view showing an example of structure for holding the MCP in the third embodiment of the electron multiplier according to the present invention.

The electron multiplier 100 according to the third embodiment is installed on the movable table 13 within the vacuum chamber 12 of the electron microscope 10 as shown in FIG. 1. In the upper part of the main body portion of the electron multiplier 100, an MCP 3 is installed. The inner face of an outer support portion 200a extending from the first end of an outer electric field shield member 200 made of an electrically conductive material such as a metal toward the reference axis AX (axis aligning with the advancing direction of the electron beam B) is bonded to the peripheral part of the first surface of the MCP 3 on the side irradiated with the electron beam B, whereas the outer face of a ring-shaped support portion 210a (inner support portion) extending from the first end of an inner electric field shield member 210 made of an electrically conductive material such as a metal toward the outer electric field shield member 200 is bonded to the peripheral part of the second surface of the MCP 3, these support portions being integrally constructed as shown in FIG. 15.

Also, in the third embodiment, a first electrode 30a is formed on the first surface of the MCP 3, whereas a second electrode 30b is formed on the whole second surface opposing the first surface. The first and second electrodes 30a, 30b are formed by vapor deposition of Inconel, Ni—Cr alloy, or the like on the first and second surfaces of the MCP 3.

Here, as shown in FIG. 14, the outer electric field shield member 200 accommodating the MCP 3 is constituted by a body portion 200d surrounding at least the side face of the MCP 3 and the outer support portion 200a (having an opening 200c for exposing the first surface of the MCP 3) extending from the first end of the body portion 200d toward the reference axis AX. Installed in the space within the outer electric field shield member 200 is the inner electric field shield member 210 comprising a body portion 210b extending along the reference axis AX so as to surround the reference axis AX and the inner support portion 210a (having an opening 210c for exposing the second surface of the MCP 3) extending from the first end of the body portion 210b and holding the MCP 3 in cooperation with the support portion 200a of the outer electric field shield member 200.

As the structure for holding the MCP 3, electrically conductive adhesives 201, 211, for example, such as silver paste, carbon paste, indium paste, solder, and the like, bond the outer electric field shield member 200 and the first electrode 30a of the MCP 3 to each other, and the inner electric field shield member 210 and the second electrode 30b of the MCP 3 to each other in order to establish reliable electric contact. Also, for reinforcement, the outer support portion 200a and the inner support portion 210a are secured to each other through the side face of the MCP 3 with an insulating adhesive 212 such as an epoxy resin type adhesive or the like (see FIG. 15).

As with the above-mentioned first and second embodiments, the MCP 3 not only functions as a mount for installing the sample 2 to be observed, but also functions to multiply electrons passing through each channel 31. Namely, the MCP 3 is provided with numerous channels 31 directed from the first surface toward the second surface, whereas the inner wall of each channel 31 is formed with a film made of a material adapted to release secondary electrons. When the MCP 3 is employed in a reflection type electron microscope, as a voltage is applied between the first and second electrodes 30a, 30b such that the potential at the electron release surface (the second surface of the MCP 3 formed with the second electrode 30b) becomes higher than that at the electron entrance surface (the first surface of the MCP 3 formed with the first electrode 30a), electrons enter the channels 31 from the entrance surface and exit from the release surface after being multiplied as being reflected by the inner walls of the channels 31.

For protecting the MCP 3 and facilitating attachment to the base 4, the outer electric field shield member 200 has a cylindrical form. Here, the outer support portion 200a of the outer electric field shield member 200 is provided with a stepped portion 200b for facilitating the positioning for bonding the MCP 3 thereto. Similarly, the inner electric field shield member 210 has a cylindrical form with the inner support portion 210a so as to make it easier to establish electric contact with a leaf spring 290a of a circuit board 220 set at the base 4 and facilitate the bonding of the MCP 3.

Also, as shown in FIG. 12, an electron reflector 700 is disposed between the MCP 3 and the base 4 so as to be separated from the MCP 3 by a predetermined distance. The surface of the electron reflector 700 facing the MCP 3 is formed with a reflecting surface 710, which reflects the electron beam B passed through interstices between pieces of the sample 2 or through the sample 2 and further through the individual channels 31 of the MCP 3.

As with the above-mentioned first and second embodiments, a voltage supply system power feed means 9 is connected to the MCP 3 and the electron reflector 700. The voltage supply system 9 comprises a variable power source 91 for applying a predetermined voltage between the first and second electrodes 30a, 30b of the MCP 3, and a variable power source 92 for applying a predetermined voltage between the second electrode 30b of the MCP 3 and the electron reflector 700. Also, as switches 93, 94 in the voltage supply system 9 are selectively operated, viewing modes of the electron microscope 10 can be switched. Namely, a transmitted electron image of the sample 2 is obtained when a predetermined voltage is supplied to the electron reflector 700 and the MCP 3, whereas a reflected electron image of the sample 2 is obtained when the electron reflector 700 and the MCP 3 are grounded.

Operations of the electron microscope equipped with the electron multiplier 100 according to the third embodiment, i.e., those in any of the cases where the transmitted electron image and reflected electron image of the sample 2 are observed, are similar to those in the electron microscope equipped with the electron multiplier of the first or second embodiment.

Figure 17:
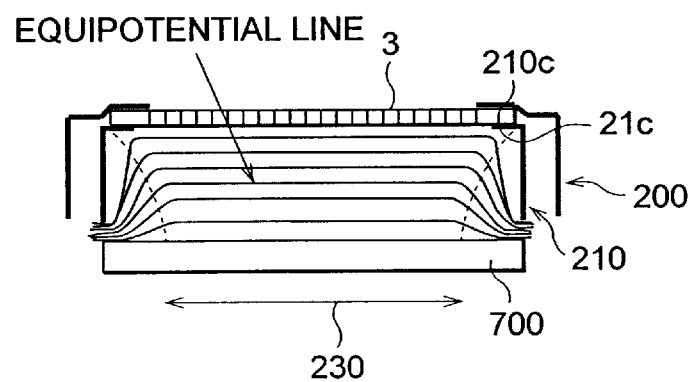
FIG. 17 is a schematic view showing the state of an electric field within an electrically conductive intermediate member (inner electric field shield member) having an inward support portion.

In the above-mentioned third embodiment, the first end of the inner electric field shield member 210 secured to the MCP 3 is provided with the outward inner support portion 210a. In this case, as indicated by equipotential lines in FIG. 16, the electric field is disturbed in the vicinity of the inner wall of the inner electric field shield member 210, thus leaving a relatively narrow region 230 where no electric field disturbance occurs. Therefore, as shown in FIG. 17, when the first end of the inner electric field shield 210 is provided with an inward support portion 210c, then the substantial outside diameter of the inner electric field shield member 210 can be enhanced, whereby the region 230 free of the electric field disturbance can be secured more widely as indicated by equipotential lines therein.

Figure 18:
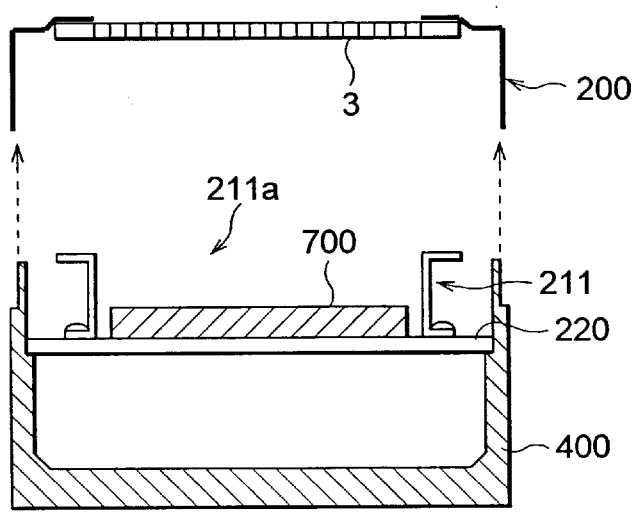
FIG. 18 is a sectional view (of a fourth embodiment) showing the electron multiplier in which an electrically conductive intermediate member (inner electric field shield member) is disposed on the base side.

Also, as shown in FIG. 18 (a fourth embodiment of the electron multiplier according to the present invention), the inner electric field shield member 210 can be secured beforehand, by means of a screw or the like, to a circuit board 220 disposed on a base 400. In this case, the MCP 3 is integrated with the outer shield member 200 alone, whereby it is unnecessary to replace the inner electric field shield member 210 when replacing the MCP 3. As a consequence, the cost of replaceable parts of the MCP can be cut down.

Figure 19A:
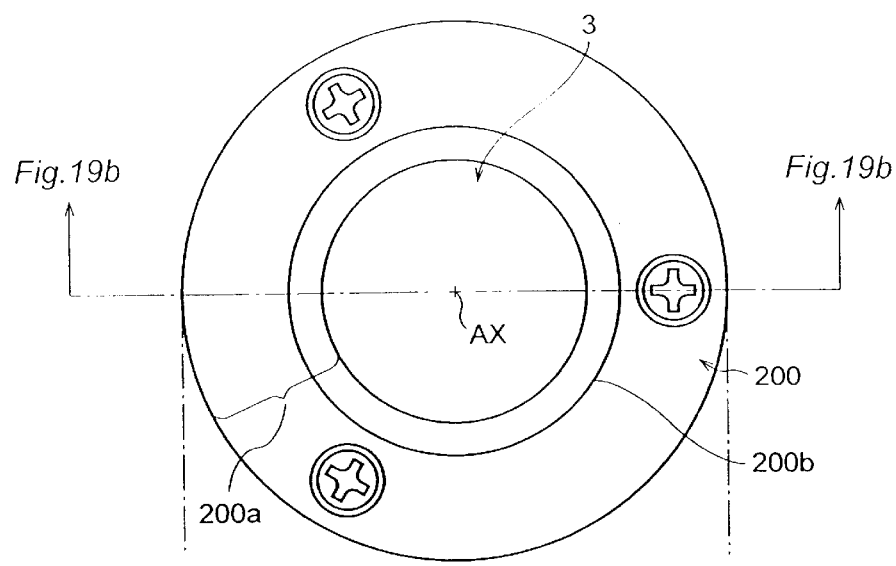
FIG. 19 is a plan and sectional view for showing a structure for securing the MCP by screws made of an insulating material, in which the sectional view shows the cross section taken along the line III—III of the plan view.
Figure 19B:
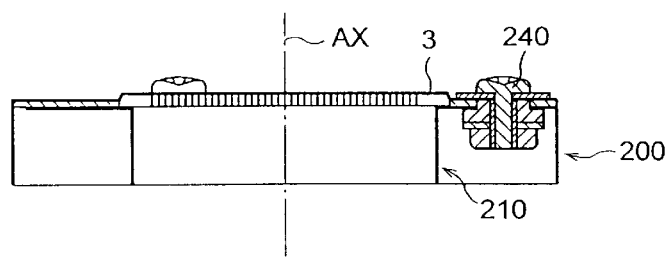
Figure 20:
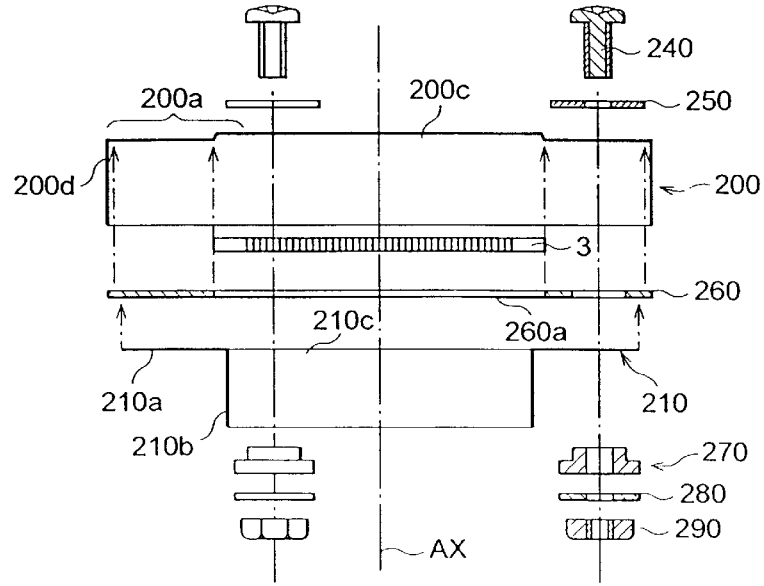
FIG. 20 is a view showing an assembling step of the structure for securing the MCP by the insulating screws shown in FIG. 19.
Figure 21A:
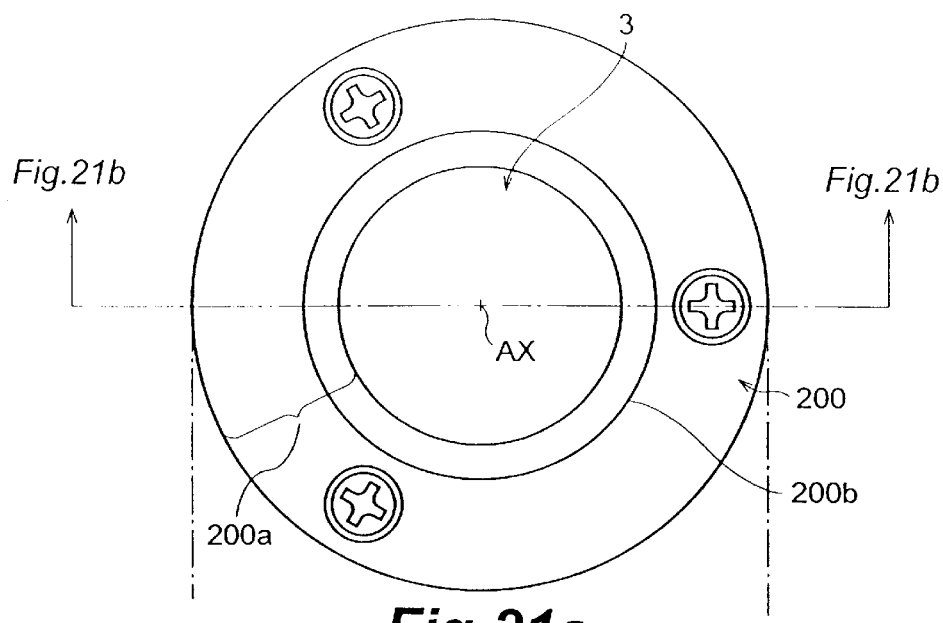
FIG. 21 is a view, identical to the plan and assembling view shown in FIG. 19, whose lines are partly omitted in order to clarify the cross-sectional form of each member.
Figure 21B:
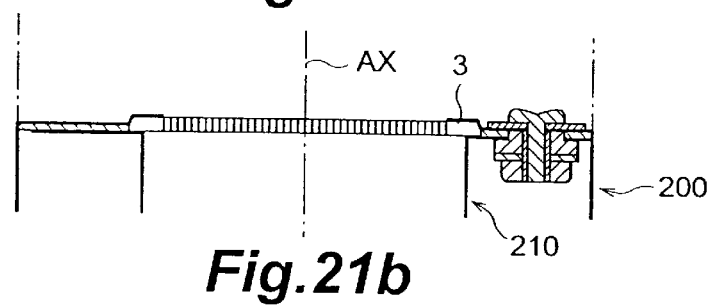
Figure 22:
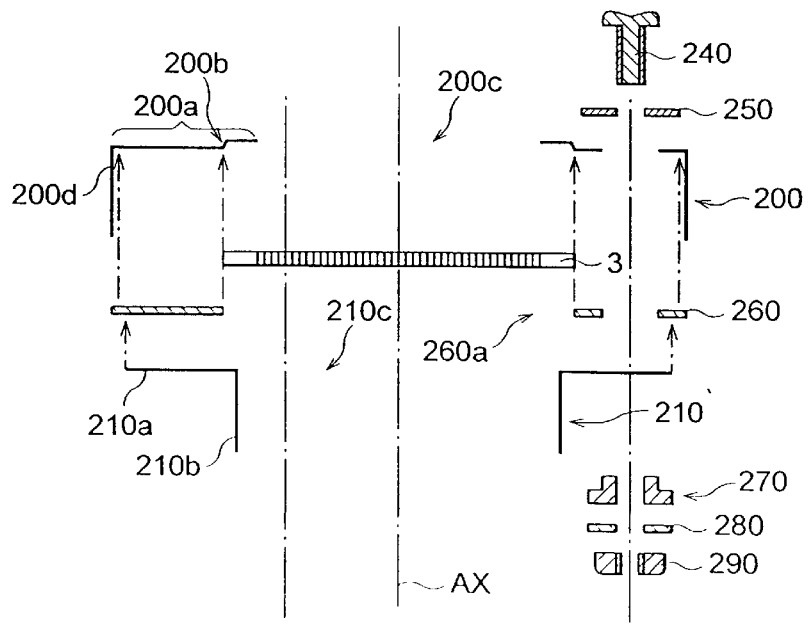
FIG. 22 is a view, identical to the plan and assembling view shown in FIG. 20, whose lines are partly omitted in order to clarify the cross-sectional form of each member.

Further, FIGS. 19 and 20 show structures for holding the MCP 3 employable in place of adhesives. Namely, FIG. 19 is a plan and sectional view for showing a structure for securing the MCP by screws made of an insulating material, in which the sectional view shows the cross section taken along the line III—III in the plan view. FIG. 20 is a view showing an assembling step of the structure for securing the MCP by the insulating screws shown in FIG. 19. FIG. 21 is a view, identical to the plan and assembling view shown in FIG. 19, whose lines are partly omitted in order to clarify the cross-sectional form of each member. Similarly, FIG. 22 is a view, identical to the plan and assembling view shown in FIG. 20, whose lines are partly omitted in order to clarify the cross-sectional form of each member.

As shown in FIGS. 19 and 20, when securing the MCP 3 by the outer electric field shield member 200 and the inner electric field shield member 210, an insulating screw such as a ceramic screw 240, for example, may be used. In this case, in order to assure electric insulation, washers 250, 270, 280 and a nut 290 are also made of ceramics, and aceramic plate 260 (having an opening 260a for fitting the MCP 3) is interposed between the above-mentioned members. As a consequence, the MCP 3 can be secured simply and reliably. Also, since this holding structure does not use any adhesive, no gas occurs therein even when the electron multiplier 100 is used in vacuum. Further, this structure can suitably be employed when the electron multiplier 100 is used in a vacuum container having a small volume.

Figure 23A:
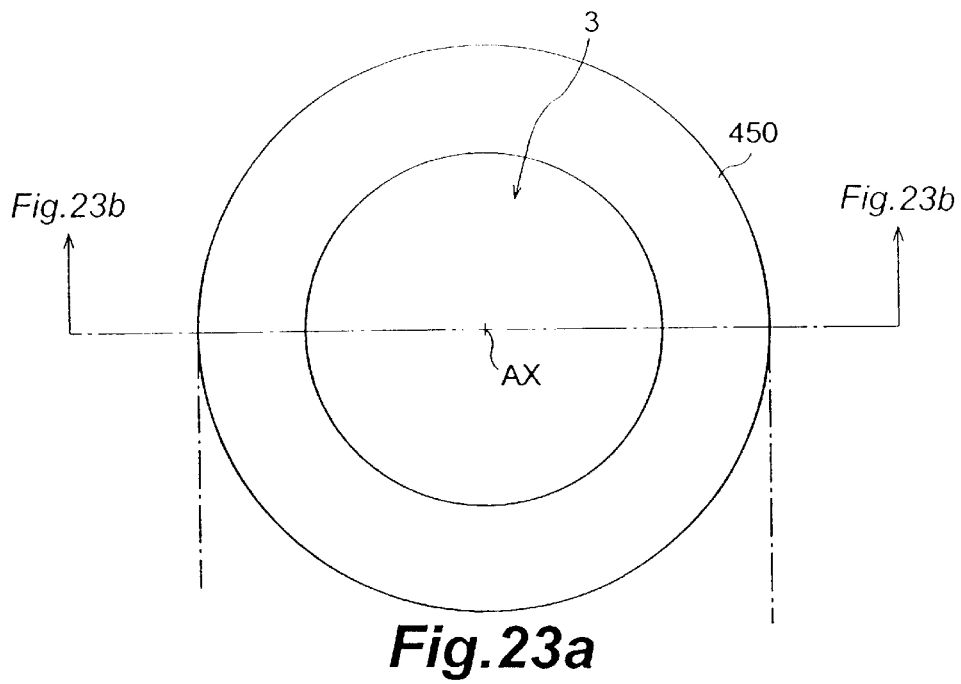
FIG. 23 is a plan and sectional view showing the configuration of a major part of a fifth embodiment of the electron multiplier according to the present invention, in which the sectional view shows the cross section taken along the line IV—IV of the plan view.
Figure 23B:
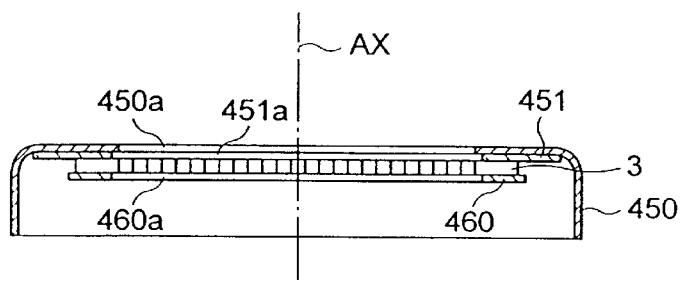
Figure 24:
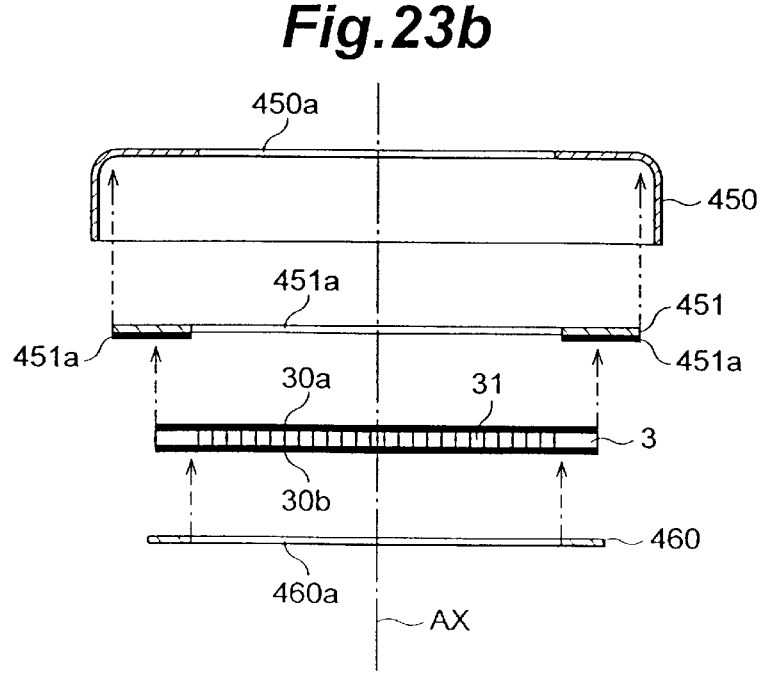
FIG. 24 is a view showing an assembling step of the major part of the fifth embodiment shown in FIG. 23.
Figure 25A:
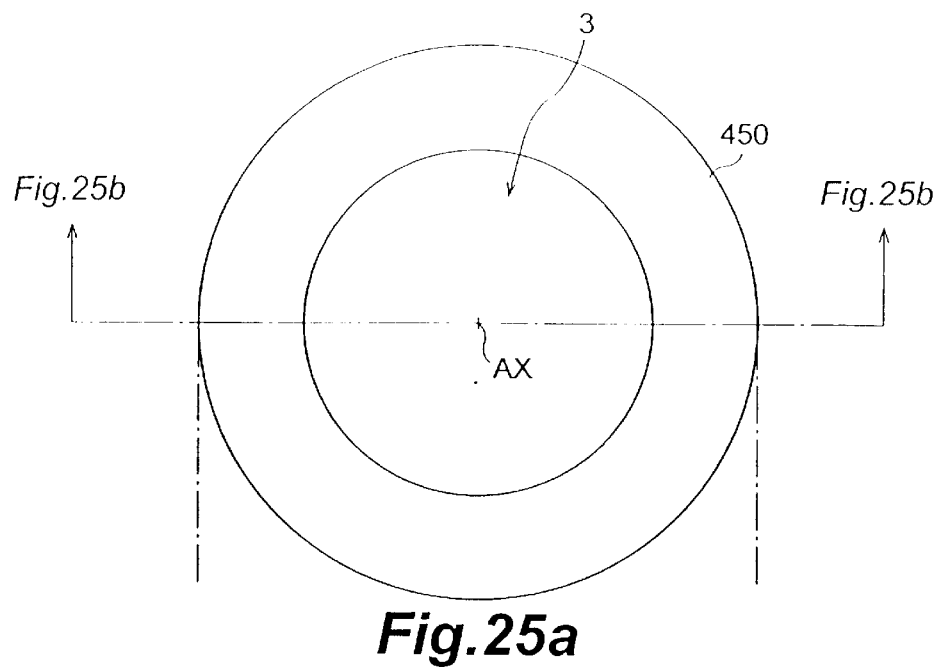
FIG. 25 is a view, identical to the plan and assembling view shown in FIG. 23, whose lines are partly omitted in order to clarify the cross-sectional form of each member.
Figure 25B:
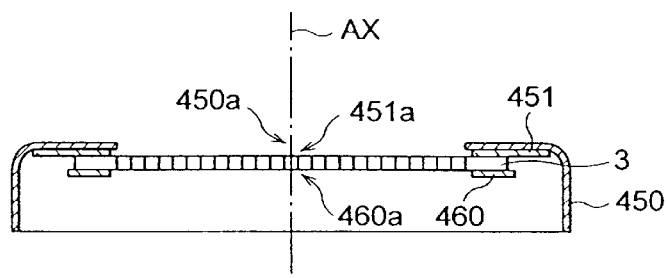
Figure 26:
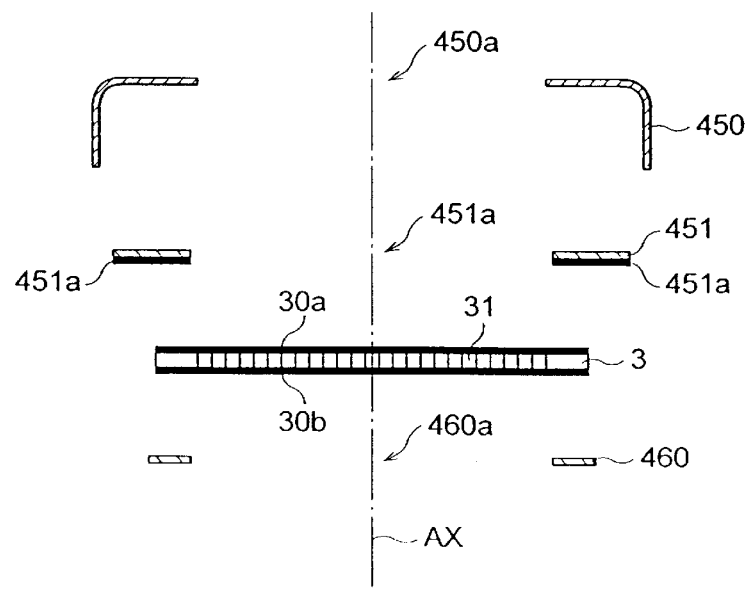
FIG. 26 is a view, identical to the plan and assembling view shown in FIG. 24, whose lines are partly omitted in order to clarify the cross-sectional form of each member.

FIG. 23 is a plan and sectional view showing the configuration of a major part of a fifth embodiment of the electron multiplier according to the present invention. Here, the sectional view shows the cross section taken along the line IV—IV of the plan view. FIG. 24 is a view showing an assembling step of the major part of the fifth embodiment shown in FIG. 23. FIG. 25 is a view, identical to the plan and assembling view shown in FIG. 23, whose lines are partly omitted in order to clarify the cross-sectional form of each member. Also, FIG. 26 is a view, identical to the plan and assembling view shown in FIG. 24, whose lines are partly omitted in order to clarify the cross-sectional form of each member.

In these drawings, a glass epoxy substrate 451, which is an insulating member, is mounted at the peripheral part of the first surface (provided with the first electrode) of the MCP 3, whereas an electrically conductive outer electric field shield member 450 is disposed so as to accommodate the glass epoxy substrate 451. Also, in place of the inner electric field shield member, an electrically conductive ring-shaped member 460 which is to be electrically connected to the second electrode is disposed at the peripheral part of the second surface (provided with the second electrode) of the MCP 3.

Here, as with each of the above-mentioned embodiments, the outer electric field shield member 450 is provided with an outer support portion, which is formed with an opening 450a for exposing the first surface of the MCP 3, whereas the ring-shaped member 460 is formed with an opening 460a for exposing the second surface of the MCP 3. Also, in FIGS. 23 to 26 showing the fifth embodiment, the configuration on the base side (electron reflector, circuit board, and the like) is omitted.

Here, the part of the glass epoxy substrate 451 coming into contact with the peripheral part of the first surface of the MCP 3 is covered with an electrically conductive coating 451a, whereby the first surface of the MCP 3 and the outer electric field shield member 450 are electrically insulated from each other. As a consequence of this configuration, through the electrically conductive coating 451a, the first surface of the MCP 3 can beset to a potential, other than the ground potential, different from the potential of the outer electric field shield member 450. For example, a voltage on the order of −100 V to +100 V can be set at the first surface of the MCP 3, and thus set voltage can appropriately be changed as the bleeder resistance ratio is adjusted, for instance.

When the set voltage of the first surface of the MCP 3 is thus adjusted, the reflected and multiplied electrons released from the MCP 3 can be collected by the electron detector 14 (see FIG. 1) more efficiently.

Also, as the ring-shaped member 460 is used in place of the inner electric field shield member, the distance between the MCP 3 and the not illustrated electron reflector can be shortened, thus enabling more efficient electron multiplication.

Though each of the above-mentioned embodiments relates to the case where the electron multiplier according to the present invention is employed in the reflection type or transmission type electron microscope, without being restricted thereto, the present invention is similarly applicable to various kinds of instruments such as energy analyzer and angle analyzer, while yielding effects similar to those mentioned above.

INDUSTRIAL APPLICABILITY

As explained in the foregoing, since the present invention is mounted with an electric field shield cap covering at least a side face of an MCP, the potential change caused upon switching the power feed to the MCP would not reach the outside and would not affect the orbit of the electron beam directed toward the sample installed on the MCP, whereby the deviation in field of view between the transmitted electron image and the reflected electron image can be eliminated. As a consequence, it is effective in that there is no fear of losing sight of the object to be observed, and it is unnecessary to correct the deviation in field of view. Also, when the electron entrance surface of the MCP facing the electron source and the electric field shield cap are set to their respective potentials different from each other, it is effective in collecting the reflected and multiplied electrons more efficiently.

Further, in accordance with the present invention, since the MCP is sandwiched between two electrically conductive members, its attaching/detaching operation can be carried out quite easily in a reliable manner. Also, since the MCP is held by the outer electric field shield member (electric field shield cap) and the inner electric field shield member accommodated within the outer electric field shield member, each positioned outside thereof, the MCP can be prevented from being damaged during its replacing operation, whereby the replacing operation can be carried out easily by any person.

What is claimed is:

1. An electron multiplier, comprising:
   a microchannel plate having a plurality of channels for electron multiplication, said microchannel plate extending along a predetermined reference axis from a first surface toward a second surface opposing said first surface, said first surface being located on a side on which an electron is made incident; and
   an outer electric field shield member which is an electrically conductive member defining a space for accommodating said microchannel plate, said outer electric field shield member having a body portion surrounding at least a side face of said microchannel plate while being separated therefrom by a predetermined distance.

2. An electron multiplier according to claim 1, further comprising an inner electric field shield member which is an electrically conductive member electrically connected to the second surface of said microchannel plate and is accommodated within the space defined by said outer electric field shield member while being electrically insulated from said outer electric field shield member, said inner electric field shield member having an opening for exposing the second surface of said microchannel plate.

3. An electron multiplier according to claim 2, wherein said outer electric field shield member comprises an outer support portion, extending from a first end of said body portion toward said reference axis, for supporting said microchannel plate, said outer support portion having an opening for exposing the first surface of said microchannel plate.

4. An electron multiplier according to claim 3, wherein said inner electric field shield member comprises an inner support portion for holding said microchannel plate in cooperation with the outer support portion of said outer electric field shield member.

5. An electron multiplier according to claim 1, further comprising a base mounting said outer electric field shield member accommodating said microchannel plate therein, said base being electrically connected to said outer electric field shield member.

6. An electron multiplier according to claim 2, further comprising an electron reflector accommodated within the space defined by said outer electric field shield member, said electron reflector being attached to a second end of said inner electric field shield member opposing a first end thereof while being electrically insulated from said inner electric field shield member.

7. An electron multiplier according to claim 6, further comprising a circuit board accommodated within the space defined by said outer electric field shield member, said board being provided between said electron reflector and said base, said board having a spring electrode for pressing said electron reflector against the second end of said inner electric field shield member.

8. An electron multiplier according to claim 4, further comprising:
   a first electrically conductive adhesive, provided between the outer support portion of said outer electric field shield member and the first surface of said microchannel plate, for securing said microchannel plate to said outer electric field shield member;
   a second electrically conductive adhesive, provided between the inner support portion of said inner electric field shield member and the second surface of said microchannel plate, for securing said inner electric field shield member to said microchannel plate; and
   an insulating adhesive, provided in a space between the side face of said microchannel plate and the body portion of said outer electric field shield member, for securing said inner electric field shield member to said outer electric field shield member while said inner and outer electric field shield members are electrically insulated from each other.

9. An electron multiplier according to claim 4, further comprising:
   an insulating member provided within a space defined by the side face of said microchannel plate, the outer support portion of said outer electric field shield member, and the inner support portion of said inner electric field shield member; and
   an insulating screw for securing, at least, said outer support portion, said insulating member, and said inner support portion while penetrating through each thereof.

10. An electron multiplier according to claim 2, further comprising a base mounting said outer electric field shield member accommodating said microchannel plate therein, said base being electrically connected to said outer electric field shield member, one end of said inner electric field shield member being directly or indirectly secured to said base.

11. An electron multiplier according to claim 3, further comprising a spacer, provided between the outer support portion of said outer electric field shield member and the first surface of said microchannel plate, for electrically insulating said outer electric field shield member and said microchannel plate from each other, said spacer having an opening for exposing the first surface of said microchannel plate.

12. An electron multiplier, comprising:
   a microchannel plate having a plurality of channels for electron multiplication, said microchannel plate extending along a predetermined reference axis from a first surface toward a second surface opposing said first surface, said first surface being located on a side on which an electron is made incident; and an electric field cap as an outer electric field shield member having a body portion surrounding at least a side face of said microchannel plate while being separated therefrom by a predetermined distance, and a support portion supporting said microchannel plate while being electrically in contact with a first electrode provided on the first surface of said microchannel plate, said body portion being an electrically conductive member defining a space for accommodating said microchannel plate, said support portion being an electrically conductive member extending from a first end of said body portion toward said reference axis and having an opening for exposing the first surface of said microchannel plate.

13. An electron multiplier according to claim 12, further comprising an intermediate member which is an electrically conductive member accommodated within the space defined by said electric field shield cap while being electrically insulated from said electric field shield cap, said intermediate member holding said microchannel plate in cooperation with the support portion of said electric field shield cap while a first end of said intermediate member is electrically in contact with a second electrode provided on the second surface of said microchannel plate, said intermediate member having an opening for exposing the second surface of said microchannel plate.

14. An electron multiplier according to claim 13, further comprising an electron reflector accommodated within the space defined by said electric field shield cap, said electron reflector being attached to a second end of said intermediate member opposing the first end thereof while being electrically insulated from said intermediate member.

15. An electron multiplier according to claim 14, further comprising a base mounting said electric field shield cap accommodating said microchannel plate therein, said base being electrically connected to said electric field shield cap.

16. An electron multiplier according to claim 15, further comprising a circuit board accommodated within the space defined by said electric field shield cap, said board being provided between said electron reflector and said base, said board having a spring electrode for pressing said electron reflector against the second end of said intermediate member.

17. An electron multiplier, comprising:

a microchannel plate having a plurality of channels for electron multiplication, said microchannel plate extending along a predetermined reference axis from a first surface toward a second surface opposing said first surface, said first surface being located on a side on which an electron is made incident;

an outer electric field shield member which is an electrically conductive member defining a space for accommodating said microchannel plate, said outer electric field shield member having a body portion surrounding at least a side face of said microchannel plate while being separated therefrom by a predetermined distance; and an inner electric field shield member which is an electrically conductive member electrically connected to the second surface of said microchannel plate and is accommodated within the space defined by said outer electric field shield member while in a state electrically insulated from said outer electric field shield member, said inner electric field shield member having an opening for exposing the second surface of said microchannel plate.

18. An electron multiplier according to claim 17, wherein said outer electric field shield member comprises an outer support portion, extending from a first end of said body portion toward said reference axis, for supporting said microchannel plate, said outer support portion having an opening for exposing the first surface of said microchannel plate.

19. An electron multiplier according to claim 18, wherein said inner electric field shield member comprises an inner support portion for holding said microchannel plate in cooperation with the outer support portion of said outer electric field shield member.

20. An electron multiplier according to claim 19, further comprising:

a first electrically conductive adhesive, provided between the outer support portion of said outer electric field shield member and the first surface of said microchannel plate, for securing said microchannel plate to said outer electric field shield member;

a second electrically conductive adhesive, provided between the inner support portion of said inner electric field shield member and the second surface of said microchannel plate, for securing said inner electric field shield member to said microchannel plate; and an insulating adhesive, provided in a space between the side face of said microchannel plate and the body portion of said outer electric field shield member, for securing said inner electric field shield member to said outer electric field shield member while said inner and outer electric field shield members are electrically insulated from each other.

21. An electron multiplier according to claim 19, further comprising:

an insulating member provided within a space defined by the side face of said microchannel plate, the outer support portion of said outer electric field shield member, and the inner support portion of said inner electric field shield member; and an insulating screw for securing, at least, said outer support portion, said insulating member, and said inner support portion while penetrating through each thereof.

22. An electron multiplier according to claim 17, further comprising a base mounting said outer electric field shield member accommodating said microchannel plate therein, said base being electrically connected to said outer electric field shield member, one end of said inner electric field shield member being directly or indirectly secured to said base.

23. An electron multiplier according to claim 18, further comprising a spacer, provided between the outer support portion of said outer electric field shield member and the first surface of said microchannel plate, for electrically insulating said outer electric field shield member and said microchannel plate from each other, said spacer having an opening for exposing the first surface of said microchannel plate.

* * * * *